(12) United States Patent
Fujiwara et al.

(10) Patent No.: US 9,207,268 B2
(45) Date of Patent: Dec. 8, 2015

(54) TYPE DETERMINATION APPARATUS, TYPE DETERMINATION METHOD, AND COMPUTER-READABLE STORAGE MEDIUM

(71) Applicants: Yukio Fujiwara, Kanagawa (JP); Takeo Tsukamoto, Kanagawa (JP); Hidenori Tomono, Kanagawa (JP); Kenji Kameyama, Kanagawa (JP); Takanori Inadome, Kanagawa (JP); Hideaki Aratani, Kanagawa (JP); Yukiko Oshima, Tokyo (JP); Hiroto Higuchi, Kanagawa (JP)

(72) Inventors: Yukio Fujiwara, Kanagawa (JP); Takeo Tsukamoto, Kanagawa (JP); Hidenori Tomono, Kanagawa (JP); Kenji Kameyama, Kanagawa (JP); Takanori Inadome, Kanagawa (JP); Hideaki Aratani, Kanagawa (JP); Yukiko Oshima, Tokyo (JP); Hiroto Higuchi, Kanagawa (JP)

(73) Assignee: RICOH COMPANY, LIMITED, Tokyo (JP)

( * ) Notice: Subject to any disclaimer, the term of this patent is extended or adjusted under 35 U.S.C. 154(b) by 32 days.

(21) Appl. No.: 13/974,450

(22) Filed: Aug. 23, 2013

(65) Prior Publication Data

US 2014/0070790 A1    Mar. 13, 2014

(30) Foreign Application Priority Data

Sep. 11, 2012  (JP) ................................. 2012-199978
Jun. 26, 2013  (JP) ................................. 2013-134339

(51) Int. Cl.
*G01R 21/00*  (2006.01)
*G01R 21/06*  (2006.01)
*G01D 4/00*   (2006.01)

(52) U.S. Cl.
CPC ............... *G01R 21/00* (2013.01); *G01D 4/002* (2013.01); *Y02B 70/3266* (2013.01); *Y02B 90/241* (2013.01); *Y04S 20/242* (2013.01); *Y04S 20/32* (2013.01)

(58) Field of Classification Search
CPC ...... G01R 19/00; G01R 21/00; G01R 21/005; G01R 21/006; G01R 21/06; G01D 4/002; Y02B 70/3266; Y02B 90/241; Y04S 20/242; Y04S 20/32
USPC ................ 324/76.11, 522, 713; 702/64, 57, 1
See application file for complete search history.

(56) References Cited

U.S. PATENT DOCUMENTS

| | | | |
|---|---|---|---|
| 5,631,554 A * | 5/1997 | Briese et al. ................ | 324/76.77 |
| 7,483,797 B2 * | 1/2009 | Nambu .......................... | 702/60 |
| 8,000,911 B2 * | 8/2011 | Carter et al. .................... | 702/60 |
| 2011/0010106 A1 | 1/2011 | Katsukura et al. | |
| 2012/0004871 A1 * | 1/2012 | Tsao et al. ...................... | 702/61 |
| 2012/0173177 A1 * | 7/2012 | Nishiyama et al. ............ | 702/62 |
| 2013/0020871 A1 * | 1/2013 | Takehara et al. ................ | 307/32 |

(Continued)

FOREIGN PATENT DOCUMENTS

| | | |
|---|---|---|
| JP | 2011-003479 | 1/2011 |
| JP | 2011-022156 | 2/2011 |

(Continued)

*Primary Examiner* — Hoai-An D Nguyen
(74) *Attorney, Agent, or Firm* — Oblon, McClelland, Maier & Neustadt, L.L.P.

(57) ABSTRACT

A type determination apparatus includes an acquisition unit configured to chronologically acquire power consumption consumed by an electrical device; and a determination unit configured to determine that a type of the electrical device is a type to be determined in accordance with a reference pattern representing a predetermined pattern of a power fluctuation when a fluctuation pattern of the power consumption acquired for a duration equal to or more than a reference period of time is matched with the reference pattern.

8 Claims, 20 Drawing Sheets

(56) References Cited

U.S. PATENT DOCUMENTS

| | | | |
|---|---|---|---|
| 2013/0138999 A1 | 5/2013 | Tamura et al. | |
| 2014/0309963 A1 | 10/2014 | Tsukamoto et al. | |
| 2015/0058275 A1* | 2/2015 | Shimizu et al. | 706/52 |

FOREIGN PATENT DOCUMENTS

| | | |
|---|---|---|
| JP | 2013-114628 | 6/2013 |
| JP | 2013-137178 | 7/2013 |
| JP | 2014-26397 | 2/2014 |
| JP | 2014-032049 | 2/2014 |
| JP | 2014-32807 | 2/2014 |
| JP | 2014-33373 | 2/2014 |
| JP | 2014-41814 | 3/2014 |
| JP | 2014-049378 | 3/2014 |
| JP | 2014-53884 | 3/2014 |
| WO | 2013/080809 A1 | 6/2013 |
| WO | WO 2014/017619 A1 | 1/2014 |

* cited by examiner

FIG.4
(a)
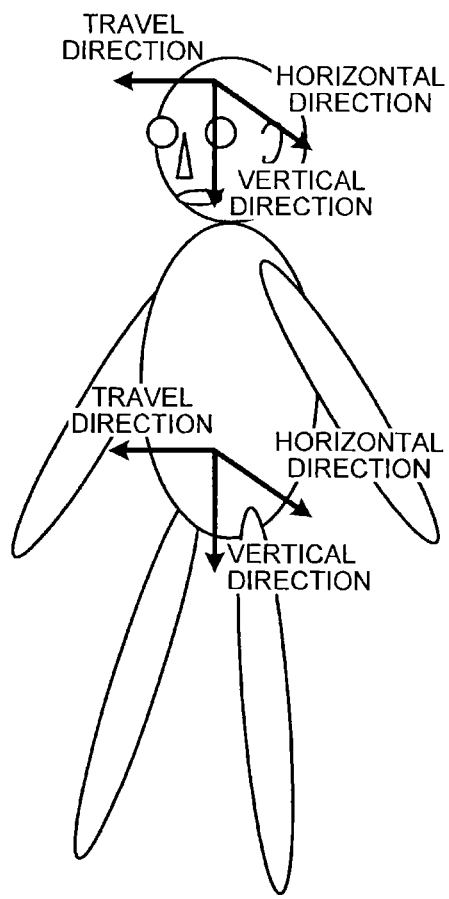
(b)
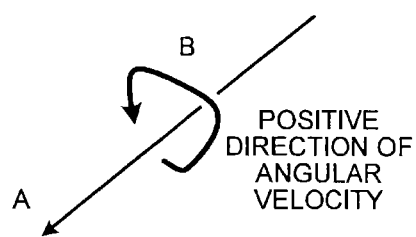

FIG.16

|  | WITHIN OFFICE HOURS |||||| OUTSIDE OFFICE HOURS ||
| --- | --- | --- | --- | --- | --- | --- | --- | --- |
|  | START-UP | OPER-ATING | BEING AWAY FROM DESK | CHARGING | MOVING | TURNING POWER OFF | STANDBY POWER | CHARGING |
| DESKTOP PC | ○ | ○ | ○ |  |  | ○ | ○ |  |
| PC MONITOR | ○ | ○ | ○ |  |  | ○ | ○ |  |
| NOTE PC | ○ | ○ | ○ | ○ | ○ | ○ | ○ | ○ |
| MOBILE PHONE | ○ | ○ | ○ | ○ | ○ | ○ | ○ | ○ |
| COPY MACHINE | ○ | ○ | ○ |  |  | ○ | ○ |  |

FIG.17

| | POWER OF DEVICE (W) | | | | | | | |
|---|---|---|---|---|---|---|---|---|
| | WITHIN OFFICE HOURS | | | | | | OUTSIDE OFFICE HOURS | |
| | STARTUP | OPERATING | BEING AWAY FROM DESK | CHARGING | MOVING | TURNING POWER OFF | STANDBY POWER | CHARGING |
| DESKTOP PC | 40 W | 40 W TO 90 W | 40 W TO 90 W | | | 2 W | 2 W | |
| PC MONITOR | 20 W | 20 W TO 22 W | 20 W | | | 1 W< | 1 W< | |
| NOTE PC | 40 W→ 20 W TO 30 W | 25 W TO 40 W | 25 W TO 40 W | 15 W>→2 W | 0 W | 2 W | 2 W | 15 W>→2 W |
| PHS | 0 W | 0 W | 0 W | 5 W>→2 W | 0 W | 0 W | 0 TO 1.5 W | 5 W>→2 W |
| COPY MACHINE | 700 W | 2000 W | 170 W | | | | 170 W | |

FIG. 18

| | TIMING | | | | | | |
|---|---|---|---|---|---|---|---|
| | WITHIN OFFICE HOURS | | | | | OUTSIDE OFFICE HOURS | |
| | STARTUP | OPERATING | BEING AWAY FROM DESK | CHARGING | MOVING | TURNING POWER OFF | STANDBY POWER | CHARGING |
| DESKTOP PC | AROUND STARTING TIME OF WORK | ALWAYS | ALWAYS | | | WHEN LEAVING OFFICE | ALWAYS | |
| PC MONITOR | AROUND STARTING TIME OF WORK | ALWAYS | ALWAYS | | | WHEN LEAVING OFFICE | ALWAYS | |
| NOTE PC | AROUND STARTING TIME OF WORK | ALWAYS | ALWAYS | ALWAYS | ALWAYS | WHEN LEAVING OFFICE | ALWAYS | ALWAYS |
| MOBILE PHONE | AROUND STARTING TIME OF WORK | ALWAYS | ALWAYS | ALWAYS | AROUND STARTING TIME OF WORK | | ALWAYS | ALWAYS |
| COPY MACHINE | AROUND STARTING TIME OF WORK | ALWAYS | ALWAYS | | | WHEN LEAVING OFFICE | ALWAYS | |

FIG.21

| WHETHER POWER BECOMES 0 W | DEVICE INTERCONNECTION | POWER CONSUMPTION FLUCTUATION | MODEL |
|---|---|---|---|
| NO | YES (MONITOR) | 50 W | DESKTOP PC |
| NO | YES (PC) | 10% | PC MONITOR |
| YES | NO | 20 W | NOTE PC |
| YES | NO | 5 W→1 W | MOBILE PHONE |
| NO | NO | 2000 W | COPY MACHINE |

TYPE DETERMINATION APPARATUS, TYPE DETERMINATION METHOD, AND COMPUTER-READABLE STORAGE MEDIUM

CROSS-REFERENCE TO RELATED APPLICATIONS

The present application claims priority to and incorporates by reference the entire contents of Japanese Patent Application No. 2012-199978 filed in Japan on Sep. 11, 2012 and Japanese Patent Application No. 2013-134339 filed in Japan on Jun. 26, 2013.

BACKGROUND OF THE INVENTION

1. Field of the Invention

The present invention relates to a type determination apparatus, a type determination method, and a computer-readable storage medium.

2. Description of the Related Art

For example, electrical devices, such as PCs, that are used by users are installed in offices and the like. Such electrical devices may consume electric power (standby power) even when the users are away such as after office hours and on holidays. It is desirable that consumption of unnecessary power be suppressed to realize power saving. On the other hand, standby power is not always unnecessary power. For example, some electrical devices need standby power to maintain their built-in clock functions. Hence, when the model (type) of an electrical device is determined, only if it is an electrical device of a type that allows the stopping of the supply of power thereto, processes such as stopping the supply of power are required.

Japanese Laid-open Patent Publication No. 2011-022156 proposes a technology for checking a feature value of a current value sampled for a predetermined time of, for example, approximately 20 ms (millisecond) against a predetermined feature value, and detecting the state of a device.

However, the method of Japanese Laid-open Patent Publication No. 2011-022156 makes determination using a feature value calculated from a measurement value (current) that fluctuates periodically and accordingly may not appropriately determine a device if there exists, for example, a plurality of devices whose periodic fluctuation patterns are consistent or similar. Moreover, in determination by measurement of a current from a distribution board as in Japanese Laid-open Patent Publication No. 2011-022156, it is not possible to accurately determine the states of devices in places such as an office where there exists a plurality of persons and a plurality of similar devices.

Therefore, there is a need to provide a type determination apparatus, a type determination method, and a computer-readable storage medium that can determine the type of a device with higher accuracy even if there exists a plurality of persons or devices.

SUMMARY OF THE INVENTION

It is an object of the present invention to at least partially solve the problems in the conventional technology.

According to an embodiment, there is provided a type determination apparatus that includes an acquisition unit configured to chronologically acquire power consumption consumed by an electrical device; and a determination unit configured to determine that a type of the electrical device is a type to be determined in accordance with a reference pattern representing a predetermined pattern of a power fluctuation when a fluctuation pattern of the power consumption acquired for a duration equal to or more than a reference period of time is matched with the reference pattern.

According to another embodiment, there is provided a type determination method that includes chronologically acquiring power consumption consumed by an electrical device; and determining that a type of the electrical device is a type to be determined in accordance with a reference pattern representing a predetermined pattern of a power fluctuation when a fluctuation pattern of the power consumption acquired for a duration equal to or more than a reference period of time is matched with the reference pattern.

According to still another embodiment, there is provided a non-transitory computer-readable storage medium with an executable program stored thereon. The program instructs a computer to perform: chronologically acquiring power consumption consumed by an electrical device; and determining that a type of the electrical device is a type to be determined in accordance with a reference pattern representing a predetermined pattern of a power fluctuation when a fluctuation pattern of the power consumption acquired for a duration equal to or more than a reference period of time is matched with the reference pattern.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 4 illustrates directions in which the sensors perform detection;

FIG. 16 is a diagram illustrating examples of actions on electrical devices;

FIG. 17 is a diagram illustrating examples of features of power consumption on an electrical device basis;

FIG. 18 is a diagram illustrating examples of timings when actions are performed on an electrical device basis;

FIG. 21 is a diagram illustrating examples of reference patterns;

DETAILED DESCRIPTION OF THE PREFERRED EMBODIMENTS

Hereinafter, an embodiment of a type determination apparatus, a type determination method, and a program will be described in detail with reference to the accompanying drawings.

The type determination apparatus of the embodiment acquires the power consumption of electrical devices over a predetermined duration or more, and compares a fluctuation pattern of the acquired power consumption with predetermined a reference pattern. If the fluctuation pattern of the power consumption matches (is consistent with or similar to) the reference pattern, the relevant electrical device is determined to be a device of a type to be determined in accordance with the reference pattern. In the embodiment, a pattern of a measurement value that fluctuates periodically is not used as in Japanese Laid-open Patent Publication No. 2011-022156, but a fluctuation pattern of power consumption acquired over the predetermined duration or more is used. Hence, it also becomes possible to determine the type of a device using a pattern of electric power fluctuating with a person's activity, for example. Moreover, even if there exist devices whose periodic fluctuation patterns of power consumption are consistent or similar, if the fluctuation patterns of power consumption for the predetermined duration or more are different, it is possible to appropriately determine the types of the devices.

Hereinafter, an example will be described in which the type determination apparatus of the embodiment is realized as an apparatus of part of a device control system that controls electric power of a device in accordance with the position and the like of a user. An applicable system is not limited to such a device control system.

Figure 1:
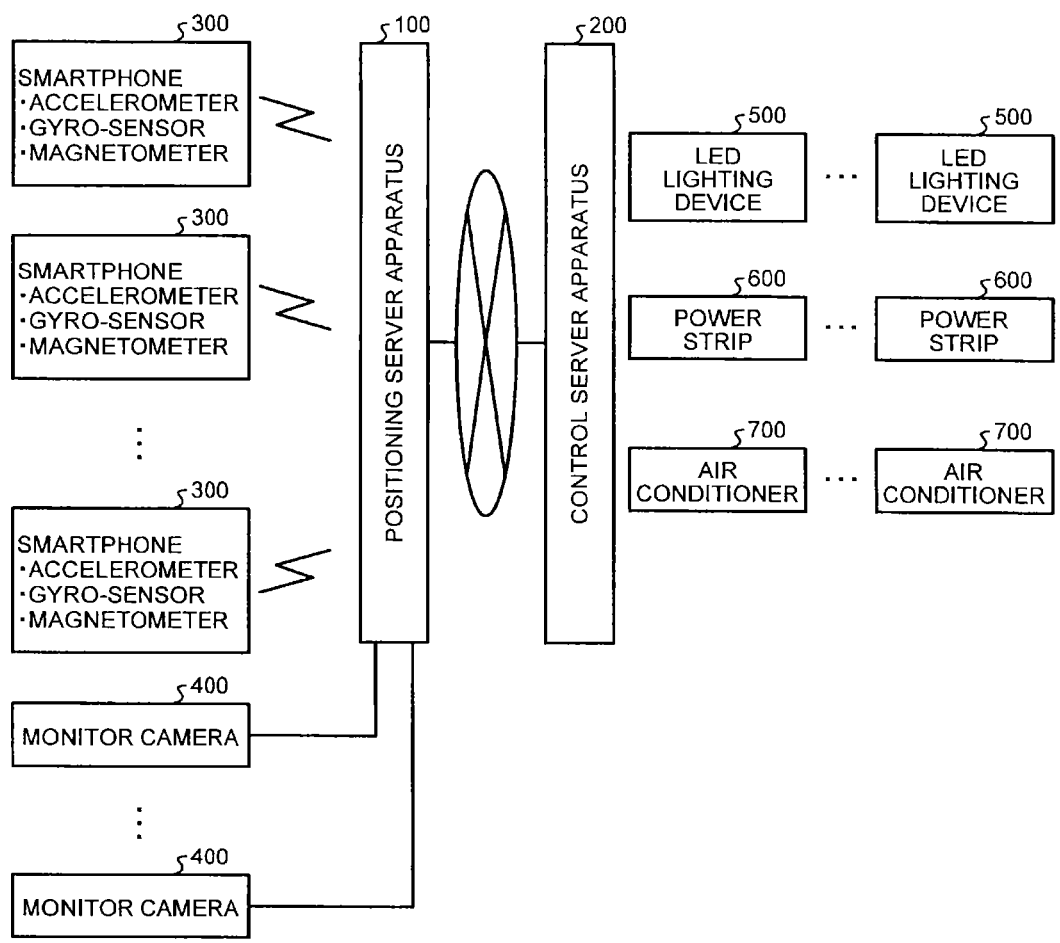
FIG. 1 is a network configuration diagram of a device control system of an embodiment.

FIG. 1 is a network configuration diagram of the device control system of the embodiment. As illustrated in FIG. 1, the device control system of the embodiment includes a plurality of smartphones 300, a plurality of monitor cameras 400 as imaging apparatuses, a positioning server apparatus 100, a control server apparatus 200 as a type determination apparatus, a plurality of LED lighting devices 500, a plurality of power strips 600, and a plurality of air conditioners 700 as devices targeted for control.

The plurality of smartphones 300, the plurality of monitor cameras 400, and the positioning server apparatus 100 are connected via a wireless communication network such as Wi-Fi (Wireless Fidelity). The format of wireless communication is not limited to Wi-Fi. Moreover, the monitor cameras 400 and the positioning server apparatus 100 may be connected by wire.

The positioning server apparatus 100 and the control server apparatus 200 are connected to a network such as the Internet or LAN (Local Area Network).

Moreover, the control server apparatus 200, the plurality of LED (Light Emitting Diode) lighting devices 500, the plurality of power strips 600, and the plurality of air conditioners 700 are connected via a wireless communication network such as Wi-Fi.

The format of communication with the control server apparatus 200, the plurality of LED lighting devices 500, the plurality of power strips 600, and the plurality of air conditioners 700 is not limited to Wi-Fi, but another wireless communication format can be used, or a wired communication format such as an Ethernet (registered trademark) cable and PLC (Power Line Communications) can also be used.

Figure 2:
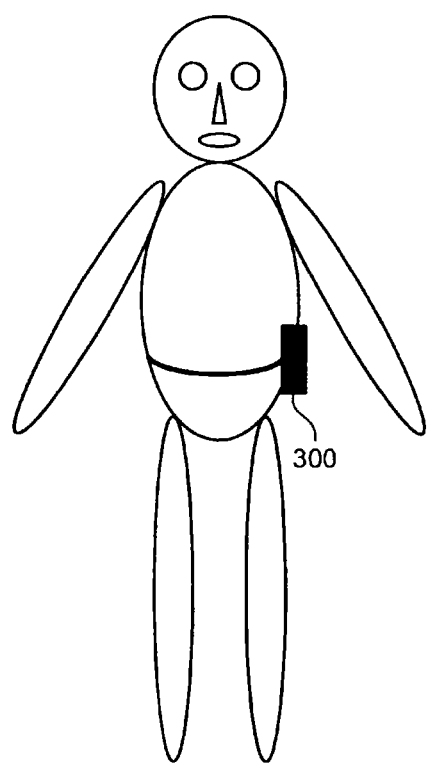
FIG. 2 is a diagram defining the wearing state and direction of a smartphone and sensors.

The smartphone 300 is an information device that is held by a person and detects the person's action. FIG. 2 is a diagram illustrating a state of wearing the smartphone 300. A person may wear the smartphone 300 at the waist as illustrated in FIG. 2, in addition to holding the smartphone 300 by the hand or the like.

Returning to FIG. 1, an accelerometer, a gyro-sensor, and a magnetometer are mounted on the smartphone 300, and detection data of each sensor is transmitted to the positioning server apparatus 100 every fixed time interval such as one second. Here, the detection data of the accelerometer is an acceleration vector. The detection data of the gyro-sensor is an angular velocity vector. The detection data of the magnetometer is a magnetic direction vector.

In the embodiment, the smartphone 300 is used as an information device that detects a person's action. However, as long as it is an information device that includes an accelerometer, a gyro-sensor, and a magnetometer and is capable of detecting a person's action, the information device is not limited to a mobile terminal such as the smartphone 300.

Moreover, it may be configured such that information devices that detect a person's action, such as an accelerometer, a gyro-sensor, and a magnetometer, are included in the smartphone 300, and an information device that detects a person's action is worn separately from the smartphone 300.

Figure 3:
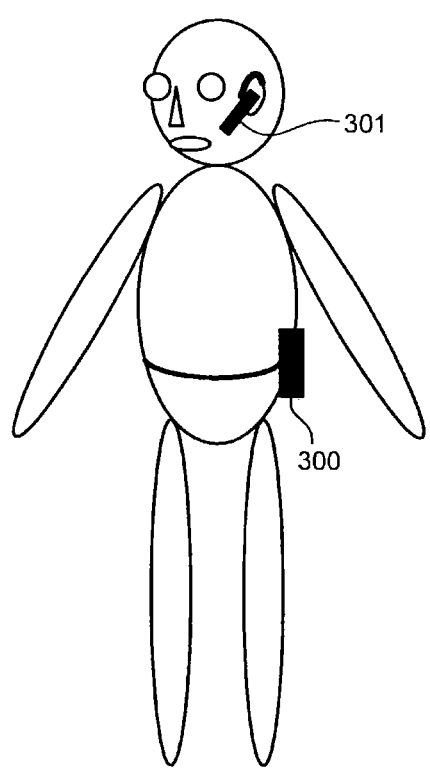
FIG. 3 is a diagram illustrating an example of wearing an information device that can detect the action of a person separately from the smartphone.

For example, FIG. 3 is a diagram illustrating an example of wearing an information device that can detect a person's action separately from the smartphone 300. As illustrated in FIG. 3, a small headset-type sensor group 301 including an accelerometer, a gyro-sensor, and a magnetometer can be worn on the head separately from the smartphone 300. In this case, detection data detected by the sensor group 301 can be transmitted by the sensor group 301 directly to the positioning server apparatus 100, and transmitted to the positioning server apparatus 100 via the smartphone 300. In this manner, a person wears the sensor group 301 on the head separately from the sensors of the smartphone 300; accordingly, it becomes possible to detect various postures.

FIG. 4 illustrates directions in which the sensors perform detection. Illustrated in (a) of FIG. 4 are directions in which the accelerometers and the magnetometers perform detection. As illustrated in (a) of FIG. 4, the accelerometer and the magnetometer enable the detection of acceleration components and geomagnetic direction components in a travel direction, a vertical direction, and a horizontal direction, respectively. Moreover, (b) of FIG. 4 illustrates angular velocity vector A to be detected by the gyro-sensor. Here, arrow B defines the positive direction of angular velocity. Considering projection of the angular velocity vector A in the travel direction, the vertical direction, and the horizontal direction illustrated in (a) of FIG. 4, they are respectively expressed as an angular velocity component in the travel direction, an angular velocity component in the vertical direction, and an angular velocity component in the horizontal direction in the embodiment.

Figure 5:
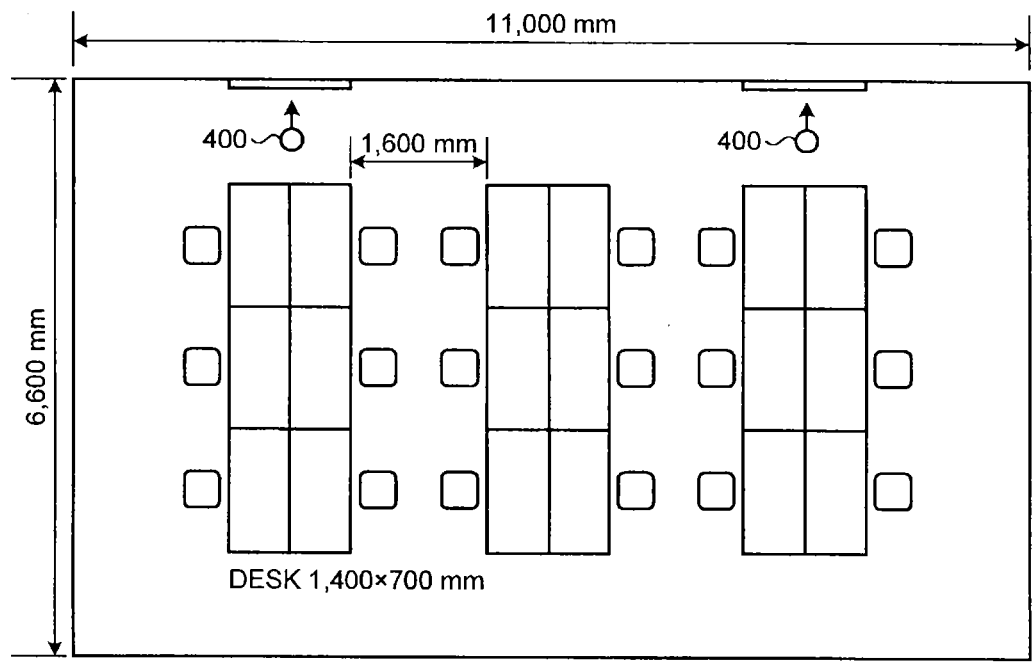
FIG. 5 is a diagram illustrating an example of an installation state of monitor cameras.

Returning to FIG. 1, the monitor cameras 400 are for capturing an image of the interior of a room being a control target area, and are installed in places such as the vicinity of a top of the room being the control target area. FIG. 5 is a diagram illustrating an example of an installation state of the monitor cameras 400. In the example of FIG. 5, there are two monitor cameras 400 installed near doors in the room, but the installation is not limited to this. The monitor camera 400 captures an image of the interior of the room being the control target area, and transmits the captured image (captured video) to the positioning server apparatus 100.

Returning to FIG. 1, in the embodiment, a lighting system, a power strip system, and an air conditioning system are targeted for power control. The plurality of LED lighting devices 500, the plurality of power strips 600, and the plurality of air conditioners 700 are targeted for power control, respectively, as the lighting system, the power strip system, and the air conditioning system.

Figure 6:
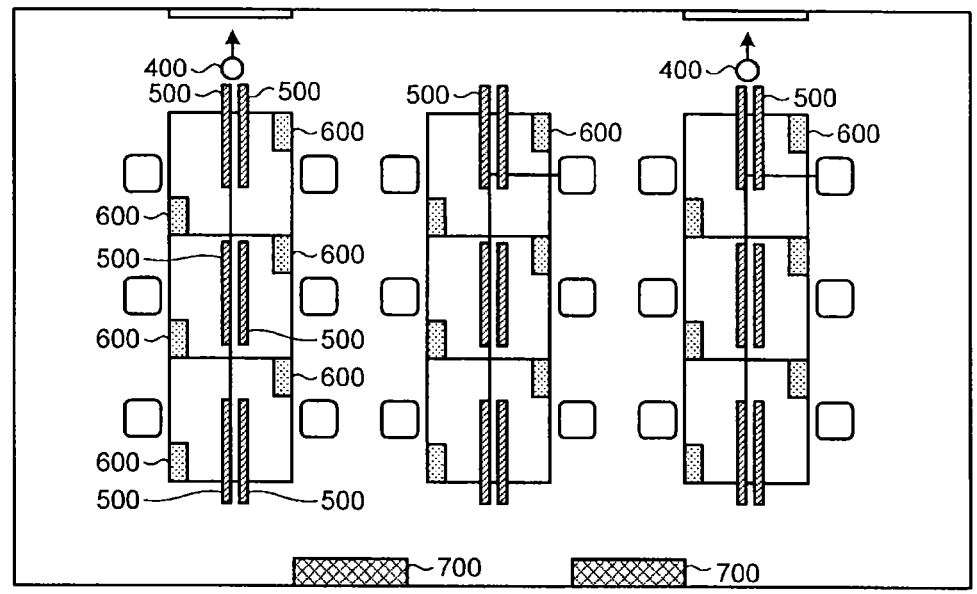
FIG. 6 is a diagram illustrating an example of an installation state of LED lighting devices, power strips, and air conditioners.

The plurality of LED lighting devices 500, the plurality of power strips 600, and the plurality of air conditioners 700 are installed in the room being the control target area. FIG. 6 is a diagram illustrating an example of an installation state of the LED lighting devices 500, the power strips 600, and the air conditioners 700.

As illustrated in FIG. 6, in the room, six desks forms one group, and three groups are provided. One LED lighting device 500 and one power strip 600 are provided to one desk. On the other hand, one air conditioner 700 is provided between two groups. Such arrangement of the LED lighting devices 500, the power strips 600, and the air conditioners 700 is an example, and arrangement is not limited to the example illustrated in FIG. 6.

Although not illustrated in FIG. 6, a system power measurement instrument installed outside the room makes it possible to grasp sum total information of all power of the interior of the room of the embodiment.

In the room, 18 users are conducting specific business activities and they enter and exit the room through the two doors. In the embodiment, the layout, the devices and the like, the number of users, and the like are limited, but the embodiment can be applied to more various layout, and devices and the like. Furthermore, the embodiment can be widely expanded and applied also to arbitrariness in the scalability of the scale of space and the number of users, and arbitrariness in a user attribute, and a variation of a type of task involved when viewed on an individual or group basis. Moreover, the embodiment is not limited to the indoor space as illustrated in FIGS. 5 and 6, and can be applied outdoors and the like.

The positioning server apparatus 100 and the control server apparatus 200 of the embodiment are installed outside the room illustrated in FIGS. 5 and 6. The positioning server apparatus 100 and the control server apparatus 200 can be provided in the room being the control target area and targeted for power control.

Moreover, in the embodiment, network devices such as a Wi-Fi access point, a switching hub, and a rooter, and the like that construct a communication network system are not targeted for power control, but can be targeted for power control. The amount of power to be consumed by these network devices and the like can be calculated as the amount of power that subtracts a sum total of power of the LED lighting devices 500, the air conditioners 700, and the power strips 600 from a sum total of power of the above system.

Each of the plurality of LED lighting devices 500, the plurality of power strips 600, and the plurality of air conditioners 700 is remotely controlled by the control server apparatus 200 via a network.

In other words, the LED lighting device 500 is remotely controlled by the control server apparatus 200 in terms of the lighting area and illuminance. Specifically, the LED lighting device 500 includes an on/off switch that can be remotely controlled individually, and the on/off control is performed by the control server apparatus 200 in a wireless control format of Wi-Fi. The LED lighting device 500 is configured to use an LED light with a dimming function considering low power consumption, and to be capable of being remotely controlled via Wi-Fi also in terms of the dimming function.

The lighting system is not limited to the LED lighting device 500, but can use, for example, an incandescent light or a fluorescent light.

The air conditioner 700 is remotely controlled by the control server apparatus 200 in terms of the turning its power on/off. In other words, the air conditioner 700 is configured to be capable of being remotely controlled individually, and its control targets are a wind direction and a fan speed in addition to turning on/off the air conditioner 700. In the embodiment, an air blowing temperature and humidity are not controlled, but the embodiment is not limited to this. The temperature and humidity can also be targeted for control.

The power strip 600 includes a plurality of power outlets, and each power outlet is remotely controlled by the control server apparatus 200 in terms of the starting and stopping of the supply of power. In other words, the power strip 600 is provided with an on/off switch that can be remotely controlled individually on a power outlet basis. The on/off control is performed by the control server apparatus 200 in the wireless control format of Wi-Fi. The number of power outlets included in one power strip 600 can be arbitrary, but it is possible to use a power strip composed of four power outlets as an example.

One power strip 600 is installed at one desk as illustrated in FIG. 6. The power strip 600 may be connected to another electrical device (not illustrated), specifically, a notebook PC, a printer apparatus, a charger, and the like, in addition to a desktop PC and a display device.

In the embodiment, the power outlet of the power strip 600 is connected to a power supply of a display device being a device where an opposed position relationship with a person is important. The display device is a device that can be controlled by the control server apparatus 200 by starting and stopping power to be supplied to the power outlet.

Even if a desktop PC body and a printer apparatus are connected to the power strip 600, the control server apparatus 200 cannot control them by starting and stopping power to be supplied to the power outlet in terms of the apparatus configurations. Hence, the desktop PC body is controlled for power saving by installing control software that enables the desktop PC to shift to a power saving mode or shutdown via a network, and is returned by a manual operation by a user himself/herself from the power saving mode or shutdown state.

Moreover, if a charger and the like, and a notebook PC during charging are connected to the power strip 600, the power strip 600 is always on considering convenience. Devices to be connected to the power outlet of the power strip 600 are not limited to them.

Returning to FIG. 1, the positioning server apparatus 100 receives detection data of the sensors, detects the position and action state of a person wearing the sensors, and transmits the position and action state to the control server apparatus 200.

Figure 7:
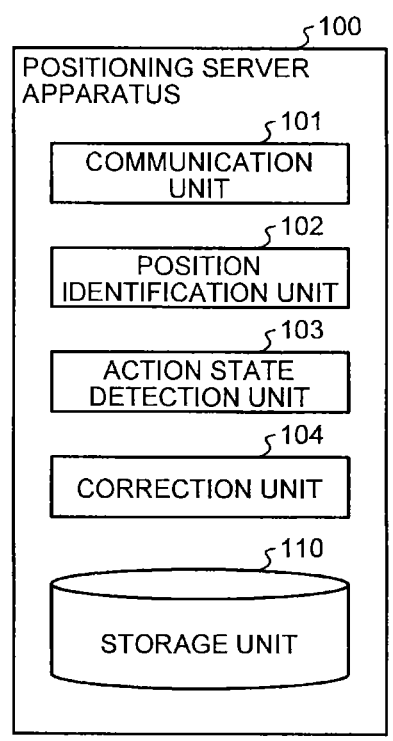
FIG. 7 is a block diagram illustrating a functional configuration of a positioning server apparatus.

FIG. 7 is a block diagram illustrating a functional configuration of the positioning server apparatus 100. As illustrated in FIG. 7, the positioning server apparatus 100 mainly includes a communication unit 101, a position identification unit 102, an action state detection unit 103, a correction unit 104, and a storage unit 110.

The storage unit 110 is a storage medium such as a hard disk drive device (HDD) or a memory, and stores therein map data of the interior of the room being the control target area.

The communication unit 101 receives detection data every fixed time interval respectively from the accelerometer, gyro-sensor, and magnetometer that are mounted on the smartphone 300, or respectively from the accelerometer, gyro-sensor, and magnetometer of the sensor group 301 separate from the smartphone 300. In other words, the communication unit 101 receives an acceleration vector from the accelerometer, receives an angular velocity vector from the gyro-sensor, and receives a magnetic direction vector from the magnetometer.

Moreover, the communication unit 101 receives a captured image from the monitor camera 400. Furthermore, the communication unit 101 transmits to the control server apparatus 200 the absolute position and action state such as direction and posture of a person, which are described below.

The position identification unit 102 analyzes the received detection data and identifies the absolute position of the person in the room with an accuracy of a human shoulder breadth or step length. The method for identifying the absolute position of a person by the position identification unit 102 is described in detail below.

The action state detection unit 103 analyzes the received detection data, and detects the action state of a person. In the embodiment, the action state detection unit 103 detects, as an action state, whether a person is in a stationary or walking state. Moreover, when the action state is the stationary state, the action state detection unit 103 detects, based on the detection data, the action state regarding the direction of the person relative to a device within the control target area, and whether the posture of the person is in a standing or sitting state.

In other words, if detecting that a person has entered the room through the door based on the captured image from the monitor camera 400, the action state detection unit 103 consecutively determines whether the action state of the person is the walking or stationary state, using chronological data, respectively, of the acceleration vectors and the angular velocity vectors among the detection data consecutively received from the accelerometer, gyro-sensor, and magnetometer of the smartphone 300 worn by the person who has entered the room, or from the accelerometer, gyro-sensor, and magnetometer of the sensor group 301 separate from the smartphone 300. Here, the method for determining whether or not the action state of a person is the walking state using acceleration vectors and angular velocity vectors is realized by a process by a dead reckoning apparatus disclosed in Japanese Laid-open Patent Publication No. 4243684. The action state detection unit 103 then determines that the person is in the stationary state when the person has been determined by the method to not be in the walking state.

More specifically, as in the process by the dead reckoning apparatus disclosed in Japanese Laid-open Patent Publication No. 4243684, the action state detection unit 103 detects the action state of a person as follows:

In other words, the action state detection unit 103 obtains a gravitational acceleration vector from the acceleration vector received from the accelerometer and the angular velocity vector received from the gyro-sensor, subtracts the gravitational acceleration vector from the acceleration vector, removes the acceleration in the vertical direction, and obtains chronological data of the residual acceleration components. The action state detection unit 103 then performs the principal component analysis on the chronological data of the residual acceleration components to obtain the travel direction of the walking action. Furthermore, the action state detection unit 103 searches for a pair of a crest peak and a trough peak of the acceleration component in the vertical direction and searches for a pair of a trough peak and a crest peak of the acceleration component in the travel direction. The action state detection unit 103 then calculates the gradient of the acceleration component in the travel direction.

Furthermore, the action state detection unit 103 determines whether or not the gradient of the acceleration component in the travel direction at a detection time of a trough peak when the acceleration component in the vertical direction changes from a crest peak to the trough peak is a predetermined value or more, and if the gradient is the predetermined value or more, determines that the action state of the person is the walking state.

On the other hand, in the above process, if the pair of a crest peak and a trough peak of the acceleration component in the vertical direction or the pair of a trough peak and a crest peak of the acceleration component in the travel direction is not searched for, or the gradient of the acceleration component in the travel direction at the detection time of a trough peak when the acceleration component in the vertical direction changes from a crest peak to the trough peak is less than the predetermined value, the action state detection unit 103 determines the action state of the person is the stationary state.

If it is determined that the person is in the stationary state, the position identification unit 102 uses the acceleration vector, the angular velocity vector, and the magnetic direction vector to obtain a relative movement vector from a reference position to a position that has been determined to be the stationary state, setting the position of the door as the reference position. Here, a method disclosed in a process of a dead reckoning apparatus of Japanese Laid-open Patent Publication No. 2011-047950 is used as the method for calculating a relative movement vector using an acceleration vector, an angular velocity vector, and a magnetic direction vector.

More specifically, as in the process of the dead reckoning apparatus of Japanese Laid-open Patent Publication No. 2011-47950, the position identification unit 102 obtains a relative movement vector as follows:

In other words, the position identification unit 102 obtains a gravity direction vector from the acceleration vector received from the accelerometer and the angular velocity vector received from the gyro-sensor and calculates the posture angle of the person as a movement direction from the gravity direction vector, and the angular velocity vector or the magnetic direction vector received from the magnetometer. Moreover, the position identification unit 102 obtains a gravitational acceleration vector from the acceleration vector and the angular velocity vector, and calculates an acceleration vector generated by a walking action from the gravitational acceleration vector and the acceleration vector. The position identification unit 102 then analyzes and detects the walking action from the gravitational acceleration vector, and the acceleration vector generated by the walking action, measures the magnitude of the walking action based on the detection result based on the gravitational acceleration vector and the acceleration vector generated by the walking action, and sets the measurement result as a step length. The position identification unit 102 then integrates the movement direction and step lengths that have been obtained in this manner to obtain a relative movement vector from the reference position. In other words, the position of a person is detected in real time with an accuracy of a human step length or shoulder breadth, for example, substantially 60 cm or less (more specifically, the order of substantially 40 cm or less).

In this manner, when the relative movement vector is calculated, the position identification unit 102 identifies a moved absolute position of the person from the relative movement vector from the door and the interior map data stored in the storage unit 110.

Consequently, the position identification unit 102 can identify the position of a person to a degree at which desk arranged in the room the person is. As a consequence, the position of the person can be identified with an accuracy of a human shoulder breadth, for example, substantially 60 cm or less (more specifically, the order of substantially 40 cm or less).

With regard to such a position accuracy, it is not true that the higher the better and that positioning can be performed at the 1 cm level. For example, assuming that two or more persons are having a conversation, they hardly talk in contact on the body, and have a certain distance between them. Hence, if accuracy is considered, appropriate accuracies in the embodiment are assumed to be an accuracy of a human shoulder breadth or step length, and an accuracy corresponding to a length from the waist to the knee regarding standing or sitting.

According to the body measurement data (Makiko Kouchi, Masaaki Mochimaru, Hiromu Iwasawa, and Seiji Mitani (2000): Anthropometric database for Japanese Population 1997-98, Life and JIS Center, Agency of Industrial Science and Technology, Ministry of International Trade and Industry) published by the Ministry of Health, Labour and Welfare, data corresponding to shoulder breadths (biacromial breadths) of young adult and senior males and females are approximately 35 cm (34.8 cm) in senior females whose mean breadth value is the lowest, and approximately 40 cm (39.7 cm) in young adult males whose mean breadth value is the highest. Moreover, the difference in the length from the waist to the knee (symphyseal height-lateral epicondyle height) is similarly approximately 34 cm to approximately 38 cm. On the other hand, when a person walks 50 m, the number of steps is 95 and accordingly a step length in a case where the person moves is approximately 53 cm (50÷95×10). The position detection method according to the present embodiment can accomplish an accuracy equivalent to the step length. Therefore, the embodiment is configured considering it is appropriate from the above data to have an accuracy of 60 cm or less, preferably 40 cm or less. These data can be a guideline of a reference for considering accuracy, but are based on Japanese. The embodiment is not limited to these numerical values.

Moreover, if the absolute position of a person is identified, and the person is in the stationary state in a seat at a desk, the action state detection unit 103 determines the direction (orientation) of the person relative to the display device based on the direction of the magnetic direction vector received from the magnetometer. Moreover, if the person is in the stationary state in the seat at the desk, the action state detection unit 103 determines the person's posture, that is, whether the person is in the standing or sitting state, based on the acceleration component in the vertical direction of the acceleration vector.

Here, with regard to the determination of whether to be the standing or sitting state, as in the dead reckoning apparatus disclosed in Japanese Laid-open Patent Publication No. 4243684, a gravitational acceleration vector is obtained from the acceleration vector received from the accelerometer and the angular velocity vector received from the gyro-sensor, and an acceleration component in the vertical direction is obtained. The action state detection unit 103 then obtains a crest peak and a trough peak of the acceleration component in the vertical direction as in the dead reckoning apparatus disclosed in Japanese Laid-open Patent Publication No. 4243684.

Figure 8:
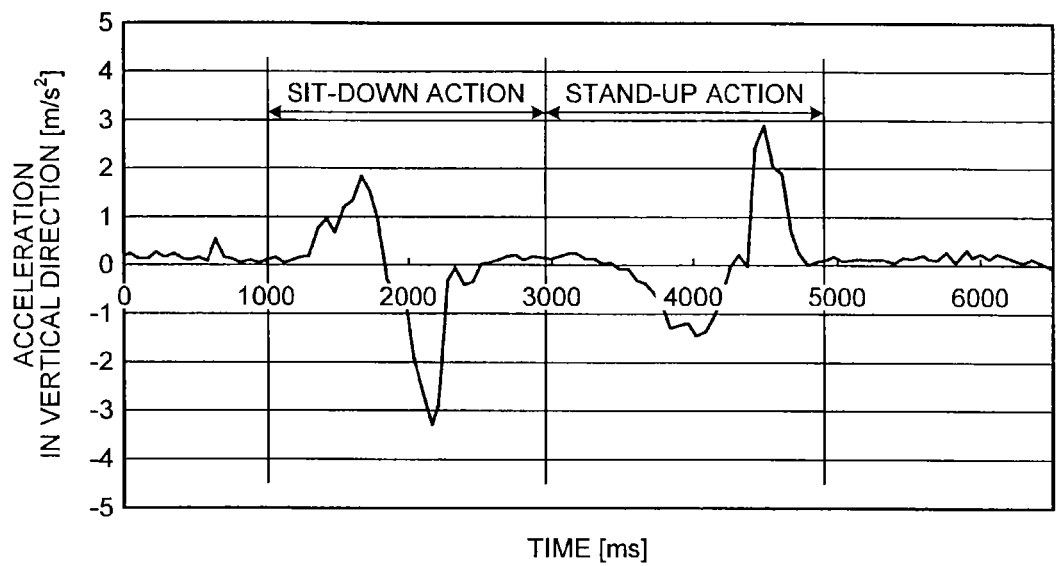
FIG. 8 is a diagram illustrating a waveform of an acceleration component in a vertical direction when a sit-down action and a stand-up action are respectively performed.

FIG. 8 is a diagram illustrating a waveform of an acceleration component in the vertical direction when a sit-down action and a stand-up action are respectively performed. As illustrated in FIG. 8, in the case of the sit-down action, the interval between a crest peak and a trough peak of the acceleration component in the vertical direction is around approximately 0.5 second. On the other hand, in the case of the stand-up action, the interval between a trough peak and a crest peak of the acceleration component in the vertical direction is approximately 0.5 second. Hence, the action state detection unit 103 determines from such an interval between the peaks whether a person is in the sitting state or standing state. In other words, the action state detection unit 103 determines that the action state of the person is the sitting state if the interval between the crest peak and the trough peak of the acceleration component in the vertical direction is within a predetermined range from 0.5 second. Moreover, the action state detection unit 103 determines that the action state of the person is the standing state if the interval between the trough peak and the crest peak of the acceleration component in the vertical direction is within a predetermined range from 0.5 second.

In this manner, the action state detection unit 103 determines whether the action state of a person is the standing state or sitting state, which indicates to have detected the position of the person in the height direction with an accuracy of substantially 50 cm or less (more specifically, substantially 40 cm or less).

Furthermore, as in the example illustrated in FIG. 3, if the smartphone 300 on which information devices, such as the accelerometer, the gyro-sensor, and the magnetometer, that detect the action of a person are mounted is worn at the waist, and the small headset-type sensor group 301 including the accelerometer, the gyro-sensor, and the magnetometer is further worn on the head, the action state detection unit 103 can further detect the following postures and actions of the person.

Figure 9:
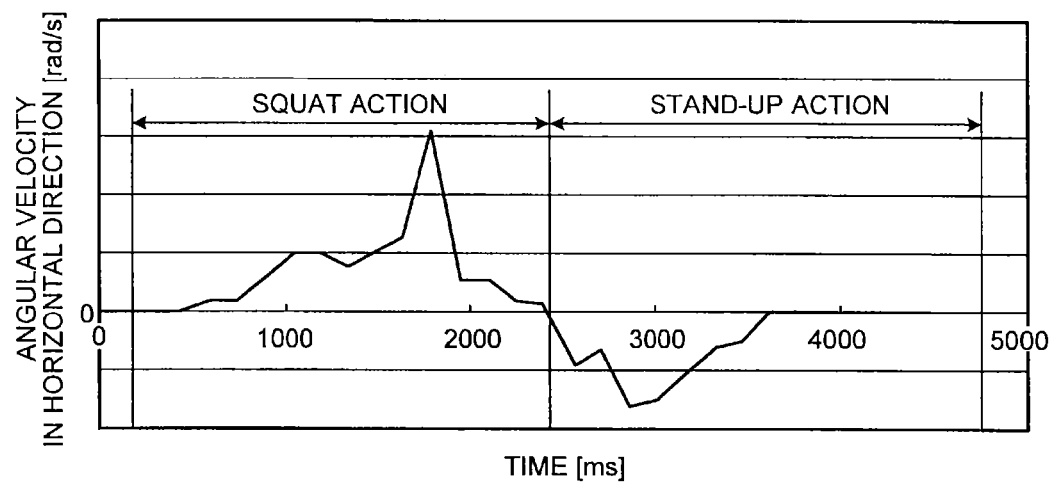
FIG. 9 is a diagram illustrating a waveform of an angular velocity component in a horizontal direction when a squat action and a stand-up action are respectively performed.

FIG. 9 is a diagram illustrating a waveform of an angular velocity component in the horizontal direction when a squat action and a stand-up action are respectively performed. A similar waveform to that of the sit-down and stand-up actions illustrated in FIG. 8 is detected from the acceleration data from the accelerometer. However, it is hard to discriminate between the squat action and the stand-up action only from the acceleration data.

Hence, the action state detection unit 103 discriminate between the squat action and the stand-up action by determining whether or not time-varying changes of the angular velocity data in the horizontal direction received from the gyro-sensor is consistent with the waveform in FIG. 9 as well as the above-mentioned method for discriminating between the sit-down action and the stand-up action based on the waveform of FIG. 8.

Specifically, the action state detection unit 103 determines first whether or not the interval between a crest peak and a trough peak of an acceleration component in the vertical direction based on the acceleration vector received from the accelerometer is within the predetermined range from 0.5 second.

If the interval between the crest peak and the trough peak of the acceleration component in the vertical direction is within the predetermined range from 0.5 second, the action state detection unit 103 determines that the person's action is the squat action when, as in the waveform illustrated in FIG. 9, an angular velocity component in the horizontal direction of the angular velocity vector received from the gyro-sensor reaches the crest peak with a sudden increase after a gradual increase from zero, and gradually returns to zero after a sudden decrease from the crest peak, and when the time taken for this is approximately two seconds.

Moreover, the action state detection unit 103 determines whether or not the interval between a trough peak and a crest peak of an acceleration component in the vertical direction is within the predetermined range from 0.5 second. If the interval between the trough peak and the crest peak of the acceleration component in the vertical direction is within the predetermined range from 0.5 second, the action state detection unit 103 determines that the person's action is the stand-up action when, as in the waveform illustrated in FIG. 9, an angular velocity component in the horizontal direction of the angular velocity vector received from the gyro-sensor reaches the trough peak in stages from zero, and gradually returns to zero from the trough peak, and when the time taken for this is approximately 1.5 seconds.

It is preferable to use the angular velocity vector received from the gyro-sensor worn on the head, as an angular velocity vector to be used for such determination of the squat action and the stand-up action in the action state detection unit 103. This is because an angular velocity component in the horizontal direction based on the angular velocity vector from the gyro-sensor worn on the head remarkably represents the waveform illustrated in FIG. 9 in the squat action and the stand-up action.

Figure 10:
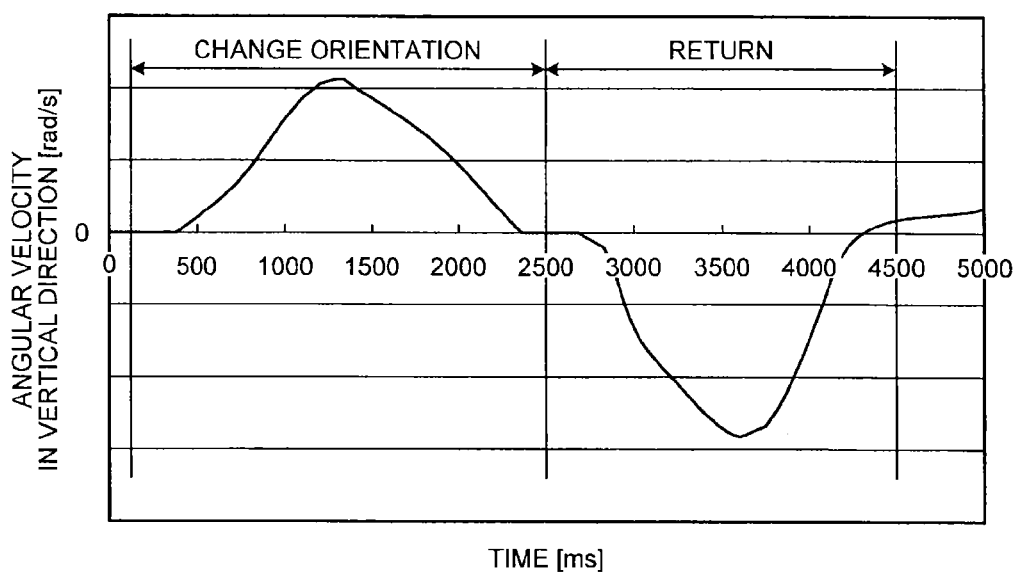
FIG. 10 is a diagram illustrating a waveform of an angular velocity component in the vertical direction when an action of changing an orientation is performed in a stationary state.

FIG. 10 is a diagram illustrating a waveform of an angular velocity component in the vertical direction when a person performs an action of changing the direction approximately 90° in the stationary state. If the angular velocity component in the vertical direction is positive, it is an action of changing the orientation to the right side, and if negative, it is an action of changing the direction to the left side.

The action state detection unit 103 determines that it is the action of changing the direction to the right side when, as in the waveform illustrated in FIG. 10, the time-varying changes of an angular velocity component in the vertical direction of the angular velocity vector received from the gyro-sensor gradually returns to zero after gradually reaching a crest peak from zero, and when the time taken for this is approximately three seconds.

Moreover, the action state detection unit 103 determines that it is the action of changing the direction to the left side when, as in the waveform illustrated in FIG. 10, the time-varying changes of the angular velocity component in the vertical direction gradually returns to zero after gradually reaching a trough peak from zero, and when the time taken for this is approximately 1.5 seconds.

The action state detection unit 103 determines that it is an action of changing the orientation of the whole body to the right or left when both angular velocity components in the vertical direction of the angular velocity vectors received from both of the gyro-sensor on the head and the gyro-sensor of the smartphone 300 at the waist represent time-varying changes similar to the waveform in FIG. 10 based on the above-mentioned determination.

On the other hand, the action state detection unit 103 determines that it is an action of changing only the direction of the head to the right or left when an angular velocity component in the vertical direction of the angular velocity vector received from the gyro-sensor on the head represents the above-mentioned time-varying changes similar to the waveform in FIG. 10, but an angular velocity component in the vertical direction of the angular velocity vector from the gyro-sensor of the smartphone 300 at the waist represents time-varying changes totally different from the waveform in FIG. 10. Considered as such an action is, for example, a posture action when a user remains sit and has a conversation with a user next to him/her.

Figure 11:
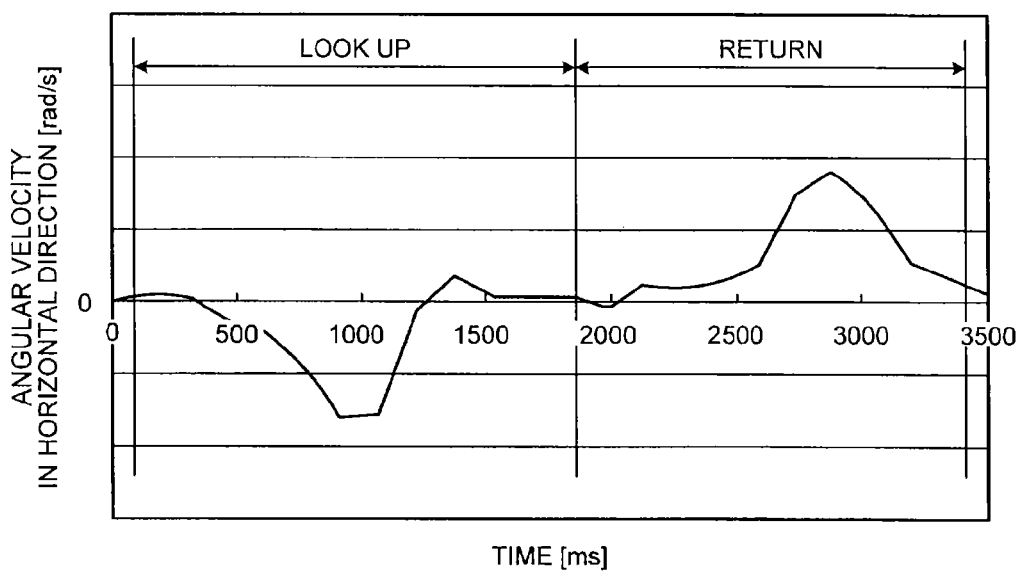
FIG. 11 is a diagram illustrating a waveform of an angular velocity component in the horizontal direction of the head when the eyes are averted upward from a display in a sitting state.

FIG. 11 is a diagram illustrating a waveform of an angular velocity component in the horizontal direction of the angular velocity vector received from the gyro-sensor on the head when the eyes are averted upward from the display in the sitting state.

Let's consider a case where the position identification unit 102 identifies the absolute position of a person as at the desk, and the action state detection unit 103 detects that the person at the desk is in the sitting state. In such a case, the action state detection unit 103 determines that it is an action of averting the eyes upward from the display (a looking up action) in the sitting state when, as in the waveform illustrated in FIG. 11, an angular velocity component in the horizontal direction of the angular velocity vector received from the gyro-sensor on the head of the person gradually reaches a trough peak from zero and then suddenly returns to zero and when the time taken for this is approximately one second. Furthermore, the action state detection unit 103 determines that it is an action of returning the eyes to the display from the state where the eyes are averted upward from the display in the sitting state when, as in the waveform illustrated in FIG. 11, the angular velocity component in the vertical direction gradually increases from zero, reaches a crest peak, and then gradually returns to zero, and when the time taken for this is approximately 1.5 seconds.

Figure 12:
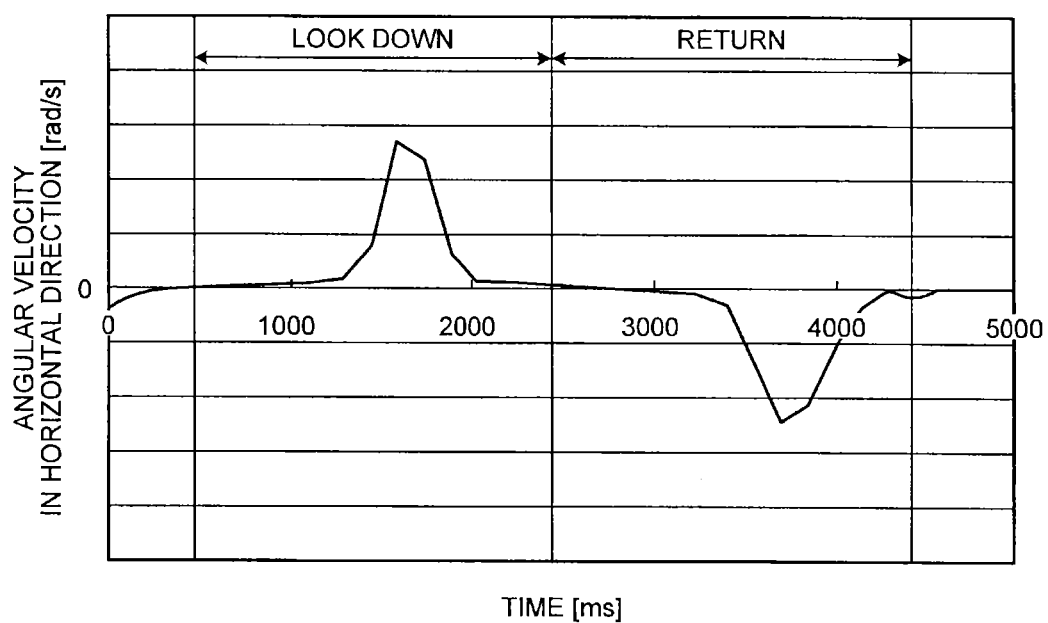
FIG. 12 is a diagram illustrating a waveform of an angular velocity component in the horizontal direction of the head when the eyes are averted downward from the display in the sitting state.

FIG. 12 is a diagram illustrating a waveform of an angular velocity component in the horizontal direction of the angular velocity vector received from the gyro-sensor on the head when the eyes are averted downward from the display in the sitting state.

Let's consider a case where the position identification unit 102 identifies the absolute position of a person at the desk, and the action state detection unit 103 detects that the person at the desk is in the sitting state. In such a case, the action state detection unit 103 determines that it is an action of averting the eyes downward from the display (a looking down action) in the sitting state when, as in the waveform illustrated in FIG. 12, an angular velocity component in the horizontal direction of the angular velocity vector received from the gyro-sensor on the head of the person suddenly reaches a crest peak from zero and then suddenly returns to zero and when the time taken for this is approximately 0.5 second.

Furthermore, the action state detection unit 103 determines that it is an action of returning the eyes to the display from the state where the eyes are averted downward from the display in the sitting state when, as in the waveform illustrated in FIG. 12, the angular velocity component in the vertical direction suddenly decreases from zero, reaches a trough peak, and then suddenly returns to zero, and when the time taken for this is approximately one second.

In this manner, the above-mentioned method enables the action state detection unit 103 to determine the postures and actions that a worker in an office may perform, in other words, walking (standing state), standing up (stationary state), sitting oneself in a chair, squatting during execution of work, changing the orientation (direction) in the sitting or standing state, looking up to the sky in the sitting or standing state, looking down in the sitting or standing state, and the like.

If the method of the dead reckoning apparatus of Japanese Laid-open Patent Publication No. 4243684 is used, a person's ascent and descent action by an elevator is also determined using an acceleration component in the vertical direction as disclosed in Japanese Laid-open Patent Publication No. 4243684.

Hence, in the embodiment, using a function of a map matching apparatus disclosed in Japanese Laid-open Patent Publication No. 2009-14713, the action state detection unit 103 can determine with high accuracy that it is the standing up or sit-down action, unlike the ascent and descent action by an elevator by the dead reckoning apparatus of Japanese Laid-open Patent Publication No. 4243684, when an acceleration component in the vertical direction is detected in the waveform illustrated in FIG. 8 in a place with no elevator.

The correction unit 104 corrects the identified absolute position and action state (direction and posture) based on the captured image from the monitor camera 400 and the map data stored in the storage unit 110. More specifically, the correction unit 104 determines whether or not the absolute position, direction, and posture of the person, which have been determined as described above, are correct, by an image analysis of the captured image of the monitor camera 400, and the like, and by use of the map data and the function of the map matching apparatus disclosed in Japanese Laid-open Patent Publication No. 2009-014713. If they are incorrect, the correction unit 104 corrects them to a correct absolute position, direction, and posture that can be obtained from the captured image and the map matching function.

The correction unit 104 may be configured to make a correction using not only the captured image from the monitor camera 400, but a restrictive method including short-range wireless such as RFID and Bluetooth (registered trademark), and optical communications.

Moreover, in the embodiment, the action state, relative movement vector from the reference position, posture (standing or sitting state) of a person are detected using a technology similar to the dead reckoning apparatuses disclosed in Japanese Laid-open Patent Publication No. 4243684 and Japanese Laid-open Patent Publication No. 2011-47950 and a technology similar to the map matching apparatus disclosed in Japanese Laid-open Patent Publication No. 2009-14713. However, the detection method is not limited to these technologies.

Next, the control server apparatus 200 will be described in detail. Based on the position and action state (direction and posture) of a person in the room being the control target area, the control server apparatus 200 remotely controls, via a network, each of the plurality of LED lighting devices 500, the plurality of power strips 600, and the plurality of air conditioners 700 that are installed in the room.

Figure 13:
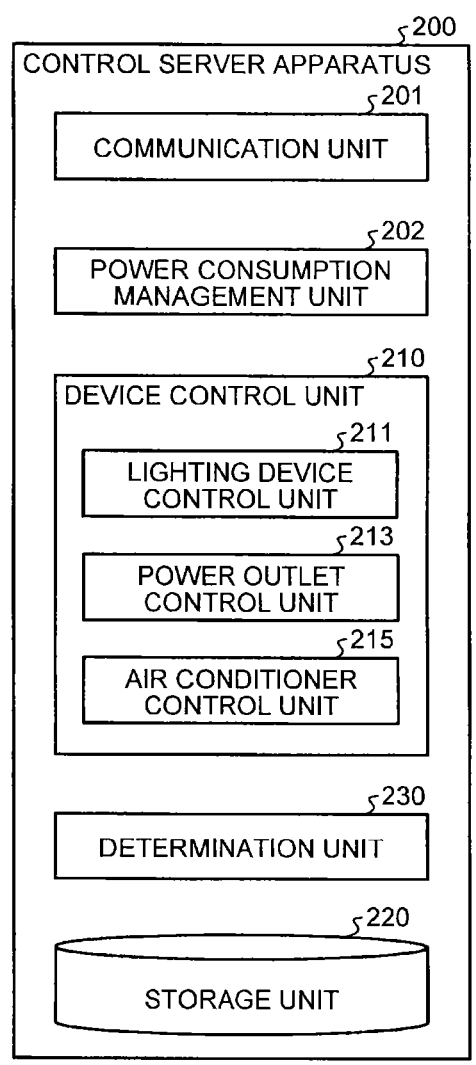
FIG. 13 is a block diagram illustrating a functional configuration of a control server apparatus of the embodiment.

FIG. 13 is a block diagram illustrating a functional configuration of the control server apparatus 200 of the embodiment. As illustrated in FIG. 13, the control server apparatus 200 in the embodiment mainly includes a communication unit 201, a power consumption management unit 202, a device control unit 210, a determination unit 230, and a storage unit 220.

The storage unit 220 is a storage medium such as an HDD or a memory, and stores therein position data of the room being the control target area.

The communication unit 201 receives the absolute position and action information (direction and posture) of a person from the positioning server apparatus 100. Moreover, the communication unit 201 receives power consumption from the plurality of LED lighting devices 500, electrical devices connected to the plurality of power strips 600, and the plurality of air conditioners 700 (an acquisition unit). Moreover, the communication unit 201 transmits control signals to perform power control on the plurality of LED lighting devices 500, the plurality of power strips 600, and the plurality of air conditioners 700. The method for acquiring (receiving) power consumption by the communication unit 201 may be any method as long as it can acquire power consumption consumed by the electrical devices (including the LED lighting devices 500 and the air conditioners 700) chronologically. For example, if the power strip 600 has a function of measuring and transmitting the power consumption of an electrical device connected to the power strip 600 itself, the communication unit 201 may acquire the power consumption of the electrical device from the power strip 600.

The power consumption management unit 202 manages power consumption received from the plurality of LED lighting devices 500, the electrical devices connected to the plurality of power strips 600, and the plurality of air conditioners 700. For example, the power consumption management unit 202 stores the power consumption acquired chronologically in a storage unit such as the storage unit 220 as distinguished between the devices.

The device control unit 210 includes a lighting device control unit 211, a power outlet control unit 213, and an air conditioner control unit 215. The lighting device control unit 211 controls the LED lighting device 500 based on the absolute position and action information (direction and posture) of a person. More specifically, if the person is in the sitting state, the lighting device control unit 211 transmits, via the communication unit 201 to the LED lighting device 500 arranged in the vicinity of the received absolute position, a control signal to set the lighting area of the LED lighting device 500 narrower than a predetermined area and to set the illuminance higher than a predetermined threshold value. Consequently, it becomes possible to control the lighting area and illuminance to those appropriate for an exacting task for a user who is working in the sitting state.

On the other hand, if the person is in the standing state, the lighting device control unit 211 transmits, via the communication unit 201 to the LED lighting device 500, a control signal to set the lighting area of the LED lighting device 500 wider than the predetermined area and to set the illuminance lower than the predetermined threshold value. Consequently, it becomes possible to control the lighting area and illuminance to enable a user in the standing state to look out over the entire room.

The power outlet control unit 213 controls a power outlet of the power strip 600 in terms of power on/off based on the absolute position and action information (direction and posture) of the person. More specifically, the power outlet control unit 213 transmits, via the communication unit 201 to a display device connected to the power strip 600 arranged in the vicinity of the received absolute position, a control signal to switch on a power outlet of the power strip 600, the power outlet being connected to the display device, if the person is in the sitting state and the direction with respect to the display device is the front.

On the other hand, the power outlet control unit 213 transmits, via the communication unit 201 to the display device connected to the power strip 600, a control signal to switch off a power outlet of the power strip 600, the power outlet being connected to the display device, if the person is in the standing state or the direction with respect to the display device is the back.

In this manner, the reason why power control is performed based on the direction of a person with respect to a display device is because the display device is a device that is important in an opposed relationship with the person, and it is possible to determine that the display device is being used if the direction is the front. Moreover, it is possible to determine that the display device is being used if the posture of the person is also in the sitting state. In this manner, in the embodiment, power control is performed considering the use of an actual device, and it becomes possible to perform more accurate control than performing power control simply based on a distance from the device.

Furthermore, the power outlet control unit 213 in the embodiment performs power control on a desktop PC body and a display device in interconnection with a user's individual recognition information.

The air conditioner control unit 215 controls the air conditioner 700 in terms of turning the power on/off based on the absolute position of the person. More specifically, the air conditioner control unit 215 transmits, via the communication unit 201, a control signal to turn on the air conditioner 700 set in a group where a desk at the received absolute position exists.

The determination unit 230 compares a fluctuation pattern of power consumption of an electrical device, the power consumption having been acquired for a duration equal to or more than a reference period of time, with a reference pattern, and determines that the type of the electrical device is a type to be determined in accordance with the reference pattern if the fluctuation pattern matches the reference pattern. The reference pattern represents a predetermined pattern of power fluctuations. The method for determining a device by the determination unit 230 is described in detail below.

Figure 14:
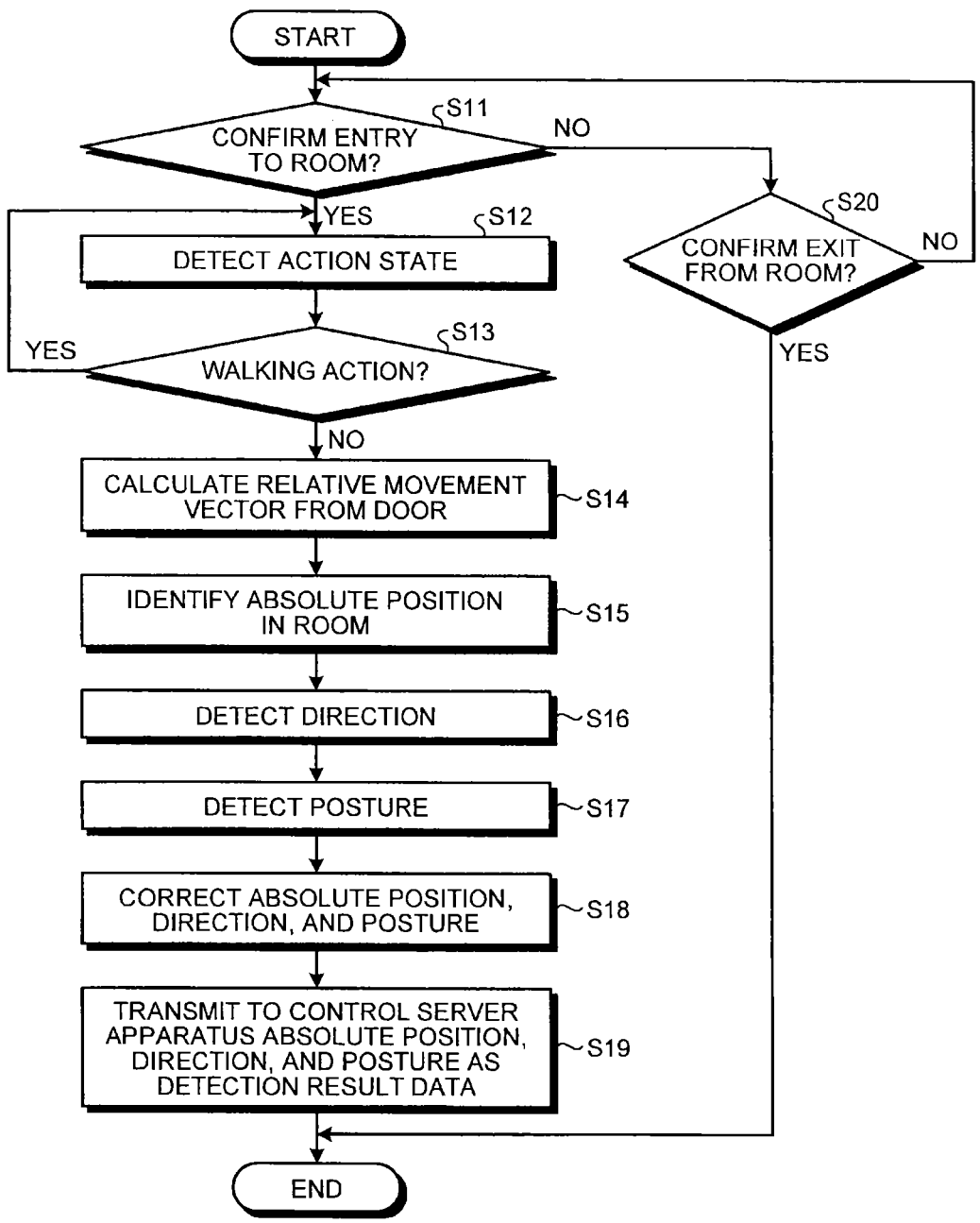
FIG. 14 is a flowchart illustrating a procedure for a detection process of the positioning server apparatus of the embodiment.

Next, a description will be given of the detection process by the positioning server apparatus 100 of the embodiment, which is configured as described above. FIG. 14 is a flowchart illustrating a procedure for the detection process of the positioning server apparatus 100 of the embodiment. The detection process according to the flowchart is executed corresponding to each of the plurality of smartphones 300.

Separately from the detection process of this flowchart, the positioning server apparatus 100 at regular intervals receives detection data (an acceleration vector, an angular velocity vector, and a magnetic direction vector) from the accelerometers, gyro-sensors, and magnetometers mounted on the plurality of smartphones 300, or from the accelerometers, gyro-sensors, and magnetometers separate from the smartphones 300, and receives captured images from the plurality of monitor cameras 400.

Firstly, it is determined from captured images of the doors that are opened and closed, and the like whether or not a person has entered the room being the control target area (Step S11). If a person has not entered the room (Step S11: No), the positioning server apparatus 100 determines whether or not a person has exited from the room (Step S20). If a person has not exited from the room (Step S20: No), the execution returns to Step S11, and the process is repeated. If a person has exited from the room (Step S20: Yes), the detection process ends. If a person has entered the room (Step S11: Yes), the action state detection unit 103 detects the action state of the person who has entered the room by the above-mentioned method (Step S12). The action state detection unit 103 then determines whether or not the action state of the person is the walking state (Step S13), and repeats the detection of the action state while in the walking state (Step S13: Yes).

On the other hand, if the action state of the person is not the walking state in Step S13 (Step S13: No), the action state detection unit 103 determines that the action state of the person is the stationary state. The position identification unit 102 then calculates a relative movement vector from the door by the above-mentioned method with the door as a reference position (Step S14).

The position identification unit 102 then identifies the absolute position of the person who has fallen in the stationary state based on the room map data stored in the storage unit 110 and the relative movement vector from the door (Step S15). Consequently, the position identification unit 102 can identify the position of the person to a degree at which desk arranged in the room the person is. As a consequence, the position of the person is identified with an accuracy of a human shoulder breadth (substantially 60 cm or less, more specifically substantially 40 cm or less).

Next, the action state detection unit 103 further detects the direction (orientation) of the person with respect to the display device from a magnetic direction vector received from the magnetometer as the action state of the person in the stationary state (Step S16).

Next, the action state detection unit 103 detects a posture of the sitting or standing state as the action state of the person by the above-mentioned method (Step S17). Consequently, the action state detection unit 103 detects the position of the person in the height direction with an accuracy of substantially 50 cm or less (more specifically, substantially 40 cm or less).

Furthermore, the action state detection unit 103 may detect, as the action state of the person, the squatting or stand-up action, the action of changing or returning the orientation in the sitting state, the action of raising or returning the eyes in the sitting state, or the action of lowering or returning the eyes in the sitting state.

Next, the correction unit 104 determines whether or not a correction is required for the identified absolute position, and the detected direction and posture as described above, and corrects them if necessary (Step S18).

The communication unit 101 then transmits to the control server apparatus 200 the absolute position and the detected direction and posture (if corrected, the corrected absolute position, and the detected direction and posture) as detection result data (Step S19).

Figure 15:
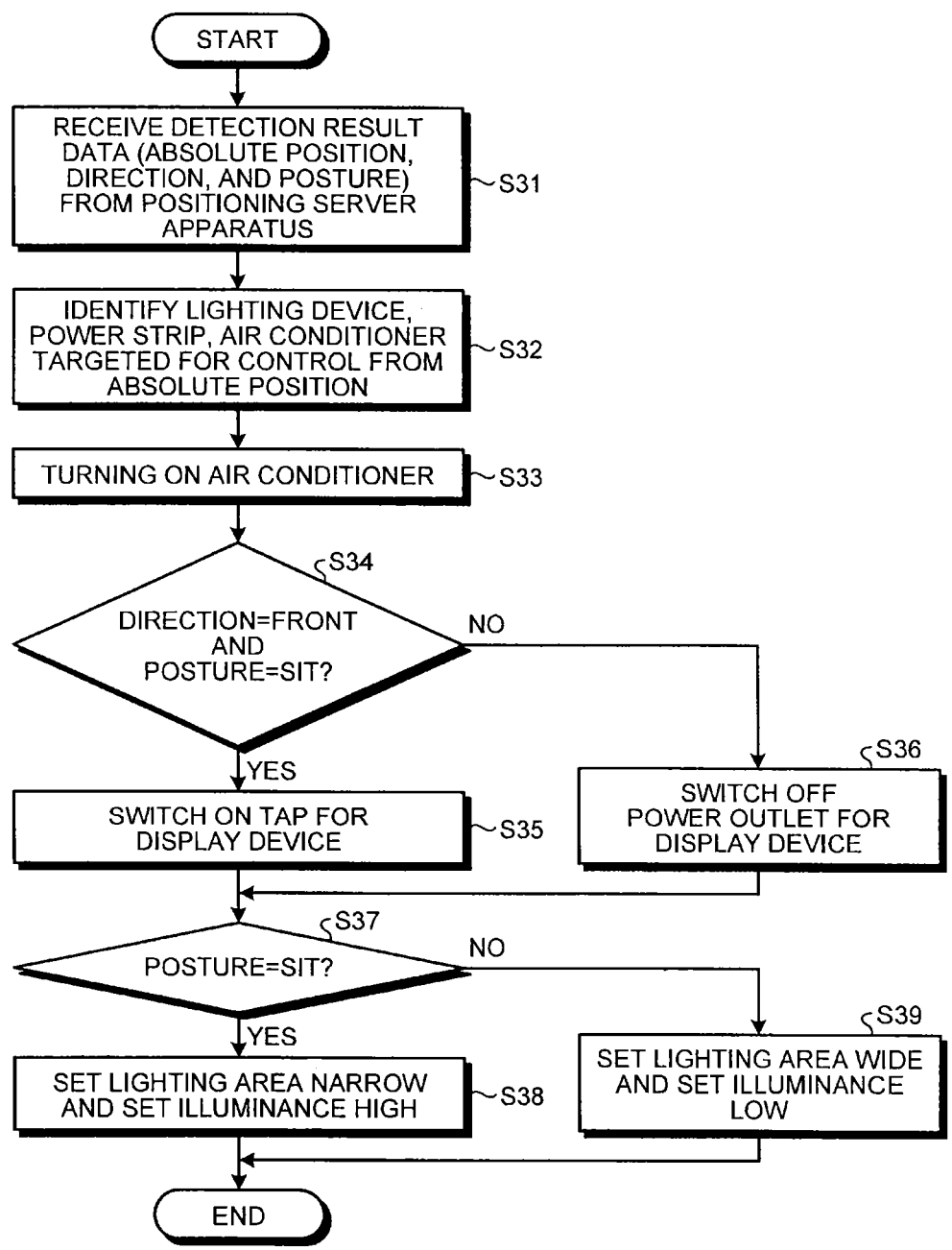
FIG. 15 is a flowchart illustrating a procedure for a device control process of the embodiment.

Next, the device control process of the control server apparatus 200 will be described. FIG. 15 is a flowchart illustrating a procedure for the device control process of the embodiment.

Firstly, the communication unit 201 receives the absolute position, direction, and posture of the person as the detection result data from the positioning server apparatus 100 (Step S31). Next, the control units 211, 213, and 215 of the device control unit 210 identify the LED lighting device 500, the power strip 600, and the air conditioner 700 that are control targets from the absolute position of the received detection result data (Step S32).

More specifically, the lighting device control unit 211 references the position data stored in the storage unit 220 and identifies, as a control target, the LED lighting device 500 installed at a desk corresponding to the absolute position. Moreover, the power outlet control unit 213 references the position data stored in the storage unit 220 and identifies, as a control target, the power strip 600 installed in the vicinity of the desk corresponding to the absolute position. The air conditioner control unit 215 references the position data stored in the storage unit 220 and identifies, as a control target, the air conditioner 700 installed in association with a group where the desk corresponding to the absolute position is.

Next, the air conditioner control unit 215 performs control to turn on the identified air conditioner 700 (Step S33).

Next, the power outlet control unit 213 determines whether or not the direction of the received detection result data is the front and the posture of the detection result data is the sitting state (Step S34). If the direction is the front and the posture is the sitting state (Step S34: Yes), the power outlet control unit 213 controls the power strip 600 identified in Step S32 to switch on a power outlet thereof connected to the display device (Step S35).

On the other hand, if the direction is the back or the posture is the standing state in Step S34 (Step S34: No), the power outlet control unit 213 controls the power strip 600 identified in Step S32 to switch off a power outlet thereof connected to the display device (Step S36).

Next, the lighting device control unit 211 determines whether or not the posture of the received detection result data is the sitting state again (Step S37). If the posture is the sitting state (Step S37: Yes), the lighting device control unit 211 performs control to set the lighting area of the LED lighting device 500 identified in Step S32 narrower than the predetermined area and to set the illuminance higher than the predetermined threshold value (Step S38).

On the other hand, if the posture is the standing state in Step S37 (Step S37: No), the lighting device control unit 211 performs control to set the lighting area of the LED lighting device 500 identified in Step S32 wider than the predetermined area and to set the illuminance lower than the predetermined threshold value (Step S39).

The control units 211, 213, and 215 of the device control unit 210 may be configured to perform control on the devices of the control targets other than the above-mentioned control.

Moreover, the control units 211, 213, and 215 of the device control unit 210 may be configured to perform control on the devices of the control targets depending on the action state of a person of the squatting or stand-up action, the action of changing or returning the orientation in the sitting state, the action of raising the eyes (the looking up action) or returning the eyes in the sitting state, or the action of lowering the eyes (the looking down action) or returning the eyes in the sitting state.

The following examples can be cited as the actions and control target devices, and control methods in such a case. These actions are actions that can happen when a state where a worker sits at the desk is assumed, and the control target devices are a PC or PC's display device, a desk lamp, a desk fan corresponding to an individual air conditioner, and the like.

For example, the power outlet control unit 213 can be configured to switch off a power outlet connected to a power supply of a PC if a worker is at a desk and if it is determined from the received detection result data that the squat action continues for a fixed time period or more. Moreover, it is possible to provide a mode control unit that controls the mode of a device to the device control unit 210, and to configure the mode control unit so as to shift a display device of the PC to a standby mode.

Moreover, it is possible to configure the mode control unit to shift the PC to the standby mode if the stand-up action is detected from the sitting state and the standing state continues for a fixed time period or more, or to configure the power outlet control unit 213 so as to simultaneously switch off a power outlet connected to a power supply of the display device.

The following control for the action of changing the orientation can be cited as an example. The power outlet control unit 213 and the mode control unit can be configured to put the PC, the display device, and a lighting device such as a desk lamp to standby or to turn them off if a change in the orientation of the face or upper-body from a state of sitting at the desk is detected, and this state continues for a fixed time period or more since situations such as that the person is having a conversation with a worker at the next desk are conceivable. The power outlet control unit 213 and the mode control unit can be configured to turn on the PC, the display device, and the lighting device such as a desk lamp if it is detected that the orientation of the worker has returned to the original state and has returned to the original posture.

Moreover, it is conceivable that the worker performs an action of looking down when he/she reads a document, and an action of looking up in the ceiling direction when he/she comes up with or thinking about an idea. Hence, it is possible to configure the power outlet control unit 213 and the mode control unit to perform control to shift the PC to the standby mode or to turn off the display device if the action of looking up or down is continued to be detected for a fixed time period or more. Furthermore, in the case of the looking down action, the power outlet control unit 213 may be configured to perform control to not turn off the desk lamp.

In this manner, in the embodiment, the position of a person is identified with an accuracy of a shoulder breadth, the direction and posture of the person are detected and accordingly power control is performed on a device. Therefore, power control of a device is enabled with higher accuracy. It is possible to realize further power saving and energy conservation while maintaining the comfort of a worker and high efficiency in a task.

In other words, in the embodiment, it is possible not only to detect a person but also to control a device belonging to the person, a lighting device immediately above a desk at which the person sits, an air conditioner, and an office device individually, and it becomes possible to simultaneously grasp the amount of power used per person.

In the known technology, even if it is possible to realize what is called "visualization" for the power of a building, an office, an entire factory, and an entire office, it is unclear how each individual saves energy, and it is impossible to continuously improve power saving since it is hard to be aware of power saving unless in tight situations such as that power consumption exceeds a total target value and that power consumption exceeds the amount of the supply of power. However, according to the embodiment, it is possible to realize further power saving and energy conservation while maintaining the comfort of a worker and high efficiency in a task.

Moreover, according to the embodiment, it is possible to further improve power saving by coordinated control not only between a person and a device but also between devices also in automatic control of devices.

Next, the process of determining the type of an electrical device by the determination unit 230 will be described in detail. Firstly, a description will be given of features of forms of use and power consumption on a type of an electrical device basis. In the following, a description will be given of an example where desktop PCs, note PCs, PC monitors, mobile phones (including smartphones and PHSs), and copy machines that are mainly used in an office are targeted for discrimination. The discrimination target devices are not limited to them, and the applicable environment is not limited to an office.

FIG. 16 is a diagram illustrating examples of actions on electrical devices. In FIG. 16, the actions on the electrical devices are illustrated, separated into a person's actions (activities) performed within office hours and actions performed outside office hours. Cited as the person's activities within office hours are startup, operating, being away from the desk, charging, moving, and turning the power off. Charging and moving are activities on electrical devices (a note PC and a mobile phone) with a built-in power storage device such as a battery.

FIG. 17 is a diagram illustrating examples of features of power consumption on an electrical device basis. In FIG. 17, the values of and the amounts of fluctuations of power consumption, and the like are illustrated for each of the actions illustrated in FIG. 16 and for each electrical device. For example, "5 W>→2 W" indicates that power consumption is to attenuate from a state of 5 W or lower to 2 W. "40 W to 90 W" indicates that power consumption changes between 40 W and 90 W. For example, "40 W→20 W to 30 W" of the note PC indicates that power consumption is to attenuate to 20 W to 30 W after reaching power consumption of 40 W at startup.

FIG. 18 is a diagram illustrating examples of timings when the actions are performed on an electrical device basis. FIG. 18 illustrates timings when the actions illustrated in FIG. 16 are performed (from the start to the end of the office hours), on an electrical device basis.

Moreover, although the illustration is omitted, the electrical device may fluctuate in power consumption in interconnection with another electrical device. For example, the "desktop PC" and the "PC monitor" are usually started almost simultaneously. Therefore, it is also possible to use interconnection with another device for the determination of a type.

As illustrated in FIGS. 16 to 18, each electrical device has a different timing when a person's action is performed, according to its type. As a consequence, the fluctuation patterns of power consumption are different. Moreover, power consumption for the same action of the person is different according to the type of the electrical device. Hence, in the embodiment, a pattern of power consumption for a predicted duration (a reference period of time) during which power consumption fluctuates accompanied by an action of a person is set as the reference pattern. The determination unit 230 then compares the acquired fluctuation pattern of the power consumption of the electrical device with the reference pattern, and determines the type of the electrical device.

A cycle to acquire power consumption is set to, for example, a cycle appropriate to determine a fluctuation pattern of power consumption accompanied by an activity of a person. For example, if a person's activities (startup, operating, being away from the desk, charging, moving, and turning the power off) illustrated in FIGS. 16 to 18 are targeted, it may be configured to acquire power consumption not in hours but in minutes (for example, every minute).

The reference period of time is arbitrary, but it is desirable to define, as the reference period of time, a duration during which power consumption is assumed to fluctuate accompanied by a person's action as described above. For example, if an electrical device used in an office is targeted for discrimination, the reference period of time may be defined in day units. If the device can be discriminated, the reference period of time may be defined in shorter units than days such as seconds, minutes, and hours. Moreover, the reference period of time may be defined in longer units than days such as weeks and months.

Figure 19:
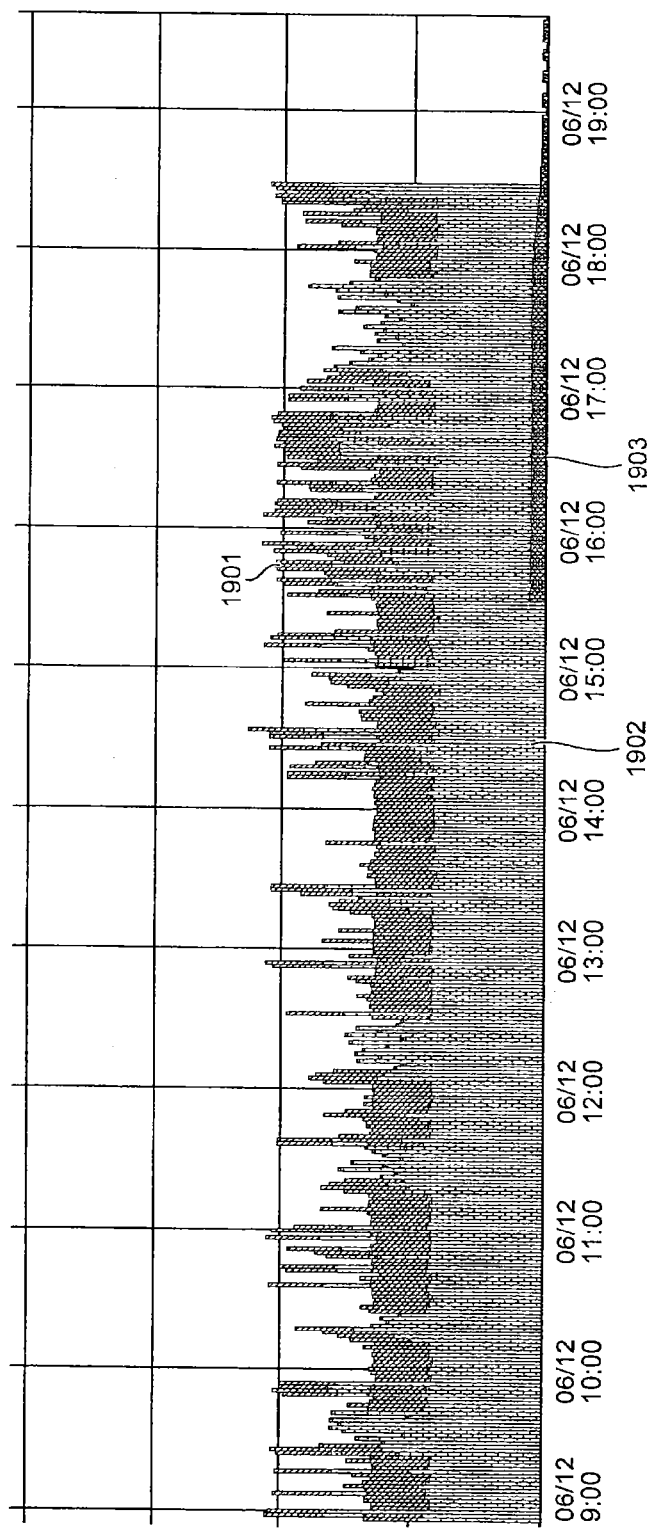
FIG. 19 is a diagram illustrating examples of fluctuation patterns of the power consumption of electrical devices.

FIG. 19 is a diagram illustrating examples of fluctuation patterns of the power consumption of electrical devices for a duration equal to or more than the reference period of time. Patterns 1901, 1902, and 1903 represent the examples of the fluctuation patterns of the power consumption of a PC monitor, a PC, and a mobile phone, respectively. As illustrated in FIG. 19, the power consumption of the PC monitor and the PC fluctuate in interconnection. The power consumption of the mobile phone has a tendency to start fluctuating by starting being charged, and decrease with the progress of charging.

Figure 20:
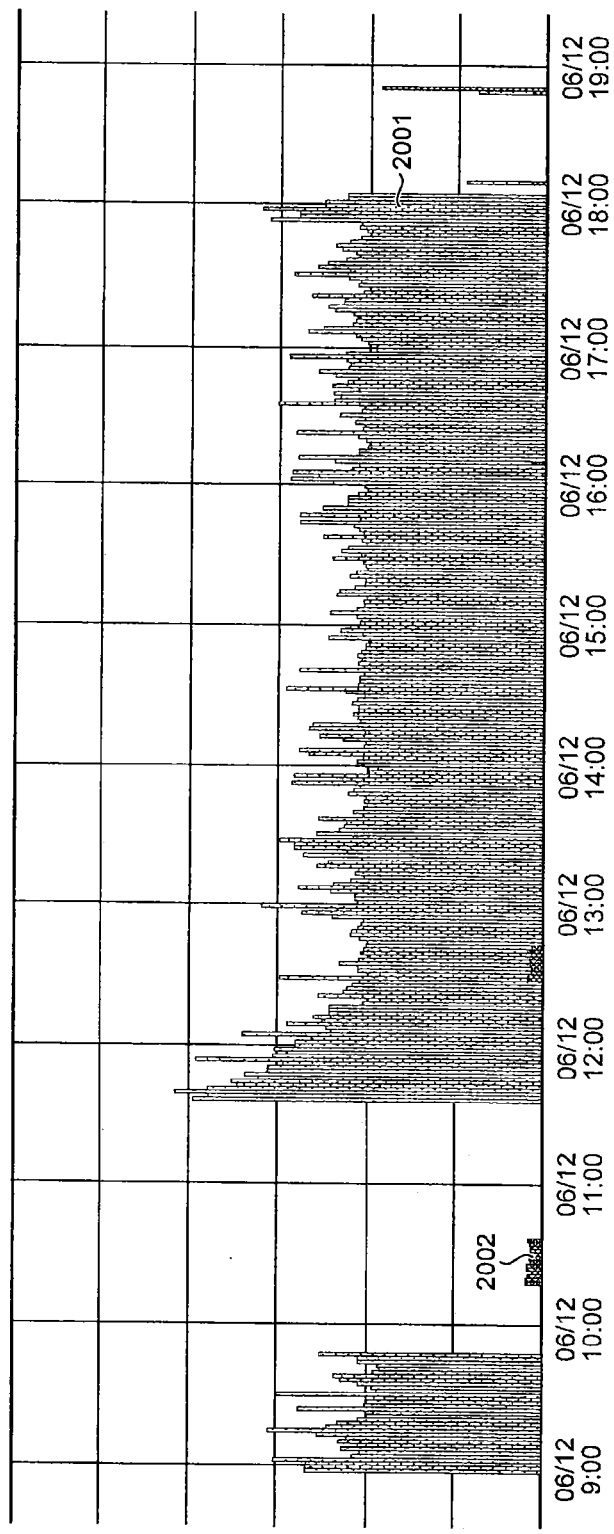
FIG. 20 is a diagram illustrating other examples of fluctuation patterns of the power consumption of electrical devices.

FIG. 20 is a diagram illustrating other examples of fluctuation patterns of the power consumption of electrical devices for a duration equal to or more than the reference period of time. Patterns 2001 and 2002 represent the examples of the fluctuation patterns of the power consumption of a note PC and a mobile phone, respectively. The connection of the note PC and the mobile phone to the power strip 600 may be cancelled with a person's movement and the like. Accordingly, as illustrated in FIG. 20, there occurs a duration during which power consumption becomes 0 W.

Considering the features illustrated in FIGS. 16 to 20, the determination unit 230 of the embodiment uses reference patterns illustrated in FIG. 21 to determine the type of an electrical device. FIG. 21 is a diagram illustrating examples of the reference patterns. FIG. 21 illustrates examples where whether to become 0 W, interconnection with another device (device interconnection), and power consumption fluctuation are set as the reference patterns. It is not necessary to set all of them as the reference patterns, but it may be configured to use at least one of them as the reference pattern. Moreover, the reference patterns are not limited to them.

Whether to become 0 W indicates whether or not power consumption becomes 0 W within a duration equal to or more than the reference period of time. Instead of determining whether to become 0 W, it may be determined whether to become equal to or less than a predetermined power threshold value.

The device interconnection indicates whether or not the power consumption of a device targeted for discrimination fluctuates in interconnection with the power consumption of another device. In FIG. 21, if interconnection is "Yes", what type of electrical device is interconnected is indicated in round brackets. That power consumption fluctuates in interconnection means, for example, that when a fluctuation in the power consumption of one electrical device occurs, the same or a similar fluctuation in power consumption occurs in the other electrical device within a predetermined time.

The power consumption fluctuation indicates a pattern of fluctuations in power consumption for a duration equal to or more than the reference period of time. "50 W" in FIG. 21 indicates that the fluctuation amount of power consumption within the duration is 50 W. The fluctuation amount of power consumption can be obtained, for example, by a difference between a maximum value and a minimum value of power consumption within the duration. The method for calculating the fluctuation amount is not limited to this. For example, a difference value of power consumption within the duration relative to an average value (or a mode) of the power consumption (or an average value of difference values within the period) may be set as the fluctuation amount. Moreover, it may be configured to specify power fluctuation with a numerical value range (for example, "50 W to 55 W").

Moreover, as illustrated by "10%" in FIG. 21, the fluctuation amount may be expressed by a ratio. For example, the ratio of a difference between an average value of power consumption within a duration equal to or more than the reference period of time and the power consumption to the average value may be set as the fluctuation amount.

Moreover, "5 W→1 W" in FIG. 21 indicates that power consumption gradually fluctuates from 5 W to 1 W. The pattern 1903 of FIG. 19 representing the power consumption pattern of the mobile phone is an example of a pattern having such a slope.

The first row of FIG. 21 indicates that if power consumption does not become 0 W, power consumption fluctuates in interconnection with the monitor, and power fluctuation is large (50 W), the type of a device targeted for discrimination is determined to be a desktop PC.

With regard to the reference pattern, it may be configured such that a predetermined reference pattern is stored in the storage unit 220 to be referenced. Moreover, the reference pattern may be used for the determination of a type corresponding to the reference pattern from power consumption acquired over a plurality of days or its pattern.

Figure 22:
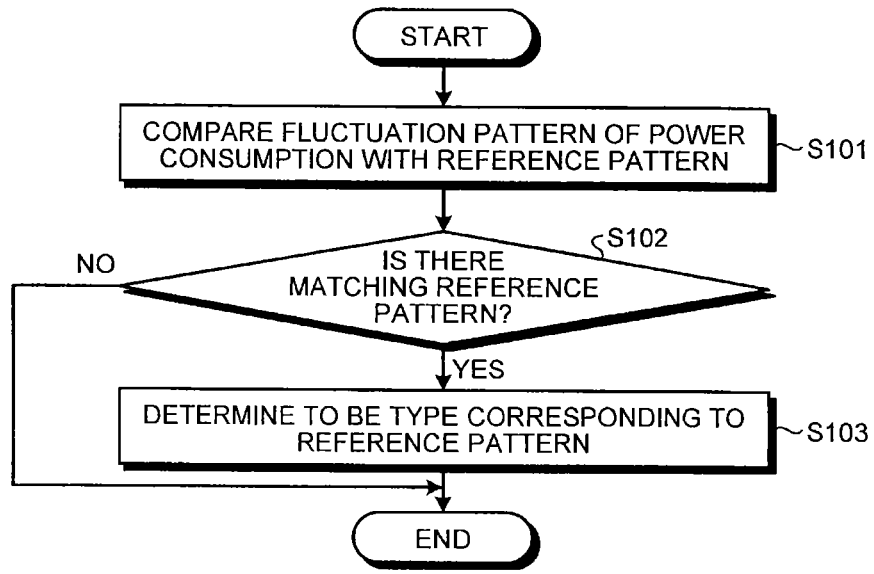
FIG. 22 is a flowchart illustrating an example of a process of determining the type of an electrical device.

FIG. 22 is a flowchart illustrating an example of the process of determining the type of an electrical device by the determination unit 230. The determination unit 230 compares fluctuation patterns of the power consumption of an electrical device, the power consumption having been received (acquired) by the communication unit 201 for a duration equal to or more than the reference period of time, with the reference patterns (Step S101). For example, if the reference patterns as in FIG. 21 are used, the determination unit 230 uses the acquired power consumption to obtains fluctuation patterns such as a fluctuation in power consumption (power fluctuation), whether there is interconnection with another electrical device, whether to become 0 W, and whether power consumption occurs at the starting time of work. The determination unit 230 then compares these fluctuation patterns with the reference patterns.

The determination unit 230 determines whether or not there is the reference pattern matching the fluctuation pattern (Step S102). If there is (Step S102: Yes), the determination unit 230 determines that the type of an electrical device targeted for discrimination is a type associated with the matching reference pattern (Step S103). If there is no reference pattern matching the fluctuation pattern (Step S102: No), the determination process ends.

As described above, the type determination apparatus of the embodiment compares a fluctuation pattern of the power consumption of an electrical device with a reference pattern and determines that the type of the electrical device is a device of a type to be determined in accordance with the reference pattern matching the fluctuation pattern. Consequently, it is possible to determine the type of a device with higher accuracy.

The determination result of the type of the device may be used in any way. For example, the power outlet control unit 213 may be configured to target an electrical device whose determined type is a predetermined specific type and turn the power off to suppress standby power. In other words, the power outlet control unit 213 may be configured to, if the power consumption of the electric apparatus being the specific type becomes standby power, switch off the power strip 600 to which the electrical device is connected. Consequently, it becomes possible to control the supply of power so as to suppress standby power after appropriately determining that the electrical device is a model that allows the stopping of the supply of power thereto.

As described above, the control server apparatus 200 may control a PC to shift to the standby mode if the standing state continues for a fixed time period or more. Furthermore, if a predetermined condition is satisfied, the supply stop process to completely eliminate the power consumption of an electrical device such as a PC may be executed. Consequently, it is possible to realize further power saving and energy conservation. Hereinafter, a description will be given of the supply stop process by the control server apparatus 200.

The determination unit 230 further includes the following function. In other words, the determination unit 230 determines whether or not power consumption acquired by the communication unit 201 is a predetermined threshold value or less. The threshold value is set to, for example, a value with which it is possible to determine whether power consumption is standby power. In this case, determination by the determination unit 230 corresponds to determination that a target electrical device is in a state of consuming standby power (for example, a power-off state).

The determination unit 230 determines whether or not a person exists within the control target area. It is desirable to use a method that allows the determination of situations where it is more certain that a user does not use an electrical device, such as after office hours and on holidays, in order to appropriately suppress standby power. Hence, the determination unit 230 may be configured to acquire, for example, information indicating that a user has exited from an attendance management system (not illustrated) and determine whether there exists a person within the control target area using the acquired information.

Moreover, the determination unit 230 may be configured to acquire information such as the absolute position of a person in the room (in the control target area) from the positioning server apparatus 100, and determine from the acquired information whether there exists a person in the control target area. For example, if the absolute position shows the position of the exit of the office, and information indicating a state where detection data cannot be received is acquired from the positioning server apparatus 100, the determination unit 230 may determine that there exists no person in the control target area.

The determination method by the determination unit 230 is not limited to them. For example, the presence or absence of a person may be determined by analyzing a captured image captured by the monitor camera 400. Moreover, if the smartphone 300 communicates in a wireless communication format, the presence or absence of a person may be determined by the presence or absence of a wireless radio wave. Moreover, it may be configured to determine that there exists no person in the control target area when information indicating that the room corresponding to the control target area has been locked from the outside is acquired.

In the embodiment, the device control unit 210 further controls the process of stopping the supply of standby power based on the determination result of the determination unit 230. For example, the power outlet control unit 213 of the device control unit 210 stops power to be supplied to an electrical device if the determination unit 230 determines that power consumption is equal to or less than the threshold value and if the determination unit 230 determines there exists no person in the target area.

Figure 23:
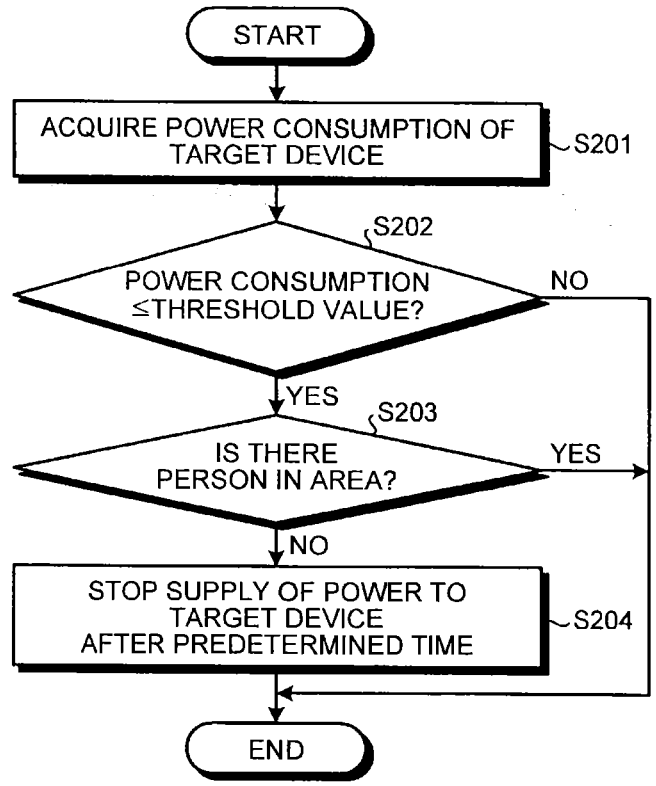
FIG. 23 is a flowchart illustrating an example of a supply stop process of the embodiment.

FIG. 23 is a flowchart illustrating an example of a procedure for the supply stop process of the embodiment. FIG. 23 is an example of a procedure when it is configured to stop the supply of power to all electrical devices to be targeted for control if there exists no person (user) in the control target area.

The communication unit 201 acquires the power consumption of a target device in the control target area (Step S201). If there exists a plurality of target devices, power consumption is acquired from the target devices. The target devices in this case are electrical devices to be determined as targets for stopping the supply of standby power. For example, apparatuses where operation cannot be stopped, such as server apparatuses (including the positioning server apparatus 100 and the control server apparatus 200), may be excluded from target devices. If there is no problem in stopping standby power of all electrical devices in the control target area, all the electrical devices may be set as target devices. The target devices may be predetermined. Otherwise, the type of an electrical device may be determined from information such as a pattern of power consumption and a specific type of electrical device may be set as a target device.

Next, the determination unit 230 determines whether or not the acquired power consumption is equal to or less than the threshold value (Step S202). If there exists a plurality of target devices, the determination unit 230 determines whether or not all power consumption acquired from the target devices are equal to or less than the threshold value.

If the power consumption is greater than the threshold value (Step S202: No), the supply stop process ends. If the power consumption is equal to or less than the threshold value (Step S202: Yes), the determination unit 230 determines whether or not there exists a person in the control target area (Step S203).

If there exists a person in the control target area (Step S203: Yes), the supply stop process ends. If there exists no person in the control target area (Step S203: No), the device control unit 210 (the power outlet control unit 213) stops the supply of power to a target device after a lapse of a predetermined period of time (for example, 30 minutes) (Step S204). After a lapse of the predetermined period of time, the determination of Steps S202 and S203 is reexecuted to confirm that power consumption is equal to or less than the threshold value and that there exists no person in the target area. The supply of power to the target device may be subsequently stopped.

Figure 24:
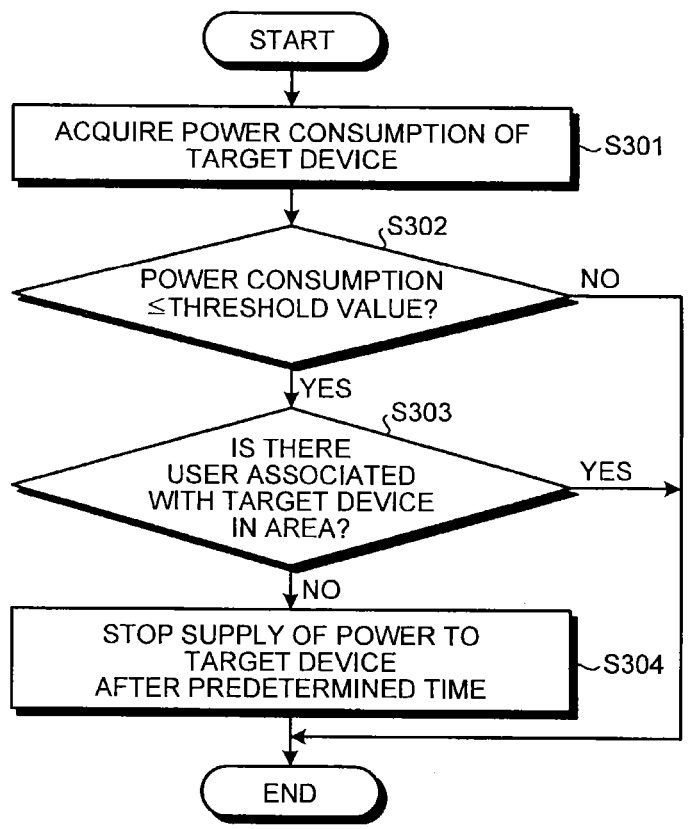
FIG. 24 is a flowchart illustrating another example of the supply stop process of the embodiment.

FIG. 24 is a flowchart illustrating another example of the procedure for the supply stop process of the embodiment. FIG. 24 is an example when the stopping of the supply of power is controlled for each target device in the control target area. In other words, FIG. 24 is an example of the procedure when it is configured to, if the power consumption of a target device becomes standby power and a person (user) who is associated with the target device is gone from the control target area, stop the supply of power to the target device. The control server apparatus 200 previously stores, for example, information associating a target device with a user in the storage unit 220 and the like, and identifies the user associated with the target device in reference with the information.

The communication unit 201 acquires the power consumption of a target device in the control target area (Step S301). Next, the determination unit 230 determines whether or not the acquired power consumption is equal to or less than a threshold value (Step S302). In the case of FIG. 24, the process of Step S302 is executed on a target device basis.

If the power consumption is greater than the threshold value (Step S302: No), the supply stop process to the target device ends. If there exists another target device, the process of FIG. 24 is further executed on the target device. In other words, if there exists a plurality of target devices, the steps of FIG. 24 are executed on each of the target devices.

If the power consumption is equal to or less than the threshold value (Step S302: Yes), the determination unit 230 determines whether or not a user associated with the target device (hereinafter referred to as the associated user) exists in the control target area (Step S303).

If there exists the associated user in the control target area (Step S303: Yes), the supply stop process ends. If there exists no associated user in the control target area (Step S303: No), the device control unit 210 (the power outlet control unit 213) stops the supply of power to the target device after a lapse of a predetermined period of time (Step S304). In the case of FIG. 24, the device control unit 210 stops only the supply of power to the target device associated with the associated user. The predetermined period of time may be set to a period of time shorter than the case of FIG. 23 (for example, 10 minutes).

As described above, if there exists no person in the target area and the power consumption of an electrical device targeted for control is determined to be equal to or less than the threshold value, the control server apparatus of the embodiment stops power to be supplied to the electrical device. Consequently, it is possible to realize further power saving and energy conservation.

Figure 25:
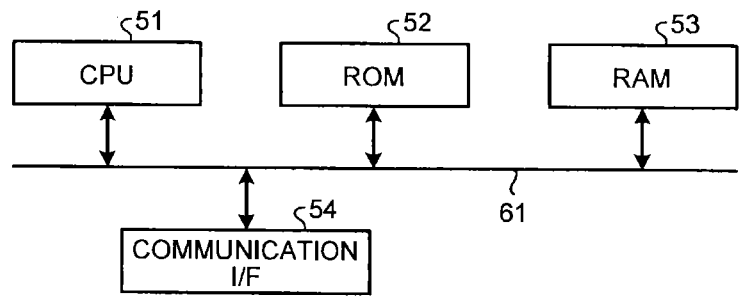
FIG. 25 is an explanatory view illustrating a hardware configuration example of the apparatuses according to the embodiment.

Next, the hardware configuration of the apparatuses (the positioning server apparatus 100 and the control server apparatus 200) according to the embodiment will be described using FIG. 25. FIG. 25 is an explanatory view illustrating a hardware configuration example of the apparatuses according to the embodiment.

The positioning server apparatus 100 and the control server apparatus 200 of the embodiment includes a control device such as a CPU 51, storage devices such as a ROM (Read Only Memory) 52 and a RAM 53, a communication I/F 54 that performs communication while being connected to a network, external storage devices such as an HDD and a CD drive device, a display device such as a display device, input devices such as a keyboard and a mouse, and a bus 61 that connects the units, and has a hardware configuration using a normal computer.

A detection program to be executed by the positioning server apparatus 100 of the embodiment and a control program to be executed by the control server apparatus 200 of the embodiment are provided by being recorded in a storage medium that can be read by computers such as a CD-ROM, a flexible disk (FD), a CD-R, and a DVD (Digital Versatile Disc) in an installable or executable format file.

Moreover, the detection program to be executed by the positioning server apparatus 100 of the embodiment and the control program to be executed by the control server apparatus 200 of the embodiment may be configured to be stored on a computer connected to a network such as the Internet and be provided by being downloaded via the network. Moreover, the detection program to be executed by the positioning server apparatus 100 of the embodiment and the control program to be executed by the control server apparatus 200 of the embodiment may be configured to be provided or distributed via a network such as the Internet.

Moreover, the detection program to be executed by the positioning server apparatus 100 of the embodiment and the control program to be executed by the control server apparatus 200 of the embodiment may be configured to be provided by being incorporated into a ROM and the like.

The detection program to be executed by the positioning server apparatus 100 of the embodiment has a module configuration including the above-mentioned units (the communication unit 101, the position identification unit 102, the action state detection unit 103, and the correction unit 104), and is configured as real hardware such that a CPU (processor) reads the detection program from the storage medium, executes the detection program and accordingly loads the above units onto a main memory, and therefore the above units are generated on the main memory.

The control program to be executed by the control server apparatus 200 of the embodiment has a module configuration including the above-mentioned units (the communication unit 201, the power consumption management unit 202, the lighting device control unit 211, the power outlet control unit 213, the air conditioner control unit 215, and the determination unit 230), and is configured as real hardware such that a CPU (processor) reads the control program from the storage medium, executes the control program and accordingly loads the above units onto a main memory, and therefore the above units are generated on the main memory.

Modification 1

It can be configured such that power control is not performed on a display device in accordance with the direction of a person based on the device control in the embodiment.

Modification 2

It can be configured such that power control is not performed on a display device in accordance with the direction of a person, and that power control is not performed on a desktop PC body and a display device in interconnection with individual recognition information based on the device control of the embodiment.

Modification 3

The device control of the embodiment can be configured to further detect postures in a correlation with the standing state and the sitting state, in addition to the standing state and the sitting state, and perform power control on a display device based on the postures.

Modification 4

The description has been given of the example where the control server apparatus 200 is functioned as the type determination apparatus. However, it may be configured to include a part or all of functions necessary for the determination process in another apparatus such as the positioning server apparatus 100.

Modification 5

Known as a technology that can detect the position of a person are methods such as access management by an IC card, detection of a person by a human sensor, a method using a wireless LAN, a method using an indoor GPS (IMES: Indoor MEssaging System), a method for performing image processing on a captured image of a camera, a method using active RFID, and a method using visible light communication, in addition to the above-mentioned method to be carried out by the positioning server apparatus 100 based on detection data of an accelerometer, a gyro-sensor, and a magnetometer.

The access management by an IC card and the like allows individual recognition, but the positioning accuracy is extremely low since the management target is the entire area. Hence, it is possible to know who is in the area but is not possible to grasp the activity state of a person in the area.

The detection of a person by a human sensor allows the obtainment of a positioning accuracy of approximately 1 to 2 m being a detection area of the human sensor, but does not allow individual recognition. Moreover, it is necessary to distribute and arrange multiple human sensors in the area to grasp the activity state of a person in the area.

The method using a wireless LAN measures distances between one wireless LAN terminal held by a person and a plurality of LAN access points installed in the area, and identifies the position of the person in the area by the principle of triangulation. This method allows individual recognition. However, the positioning accuracy depends largely on an environment and generally becomes a relatively low accuracy of 3 m or more.

In the method using an indoor GPS, a dedicated transmitter that emits radio waves of the same frequency band as that of a GPS satellite is installed indoors, and a signal where position information is embedded in a part that a normal GPS satellite transmits time information is transmitted from the transmitter. The signal is received by a receiving terminal held by a person indoors and accordingly the position of the person indoors is identified. This method allows individual recognition. However, the positioning accuracy becomes a relatively low accuracy of approximately 3 to 5 m. Moreover, it is necessary to install a dedicated transmitter and the introduction cost increases.

The method for performing image processing on a captured image of a camera allows the obtainment of a relatively high positioning accuracy of approximately several tens cm. However, it is hard to perform individual recognition. Hence, in the positioning server apparatus 100 of the embodiment, a captured image of the monitor camera 400 is used only when the absolute position, direction, and posture of an employee are corrected.

The method using active RFID identifies the position of a person by causing the person to hold an RFID tag with a built-in battery and reading the information of the RFID tag by a tag reader. This method allows individual recognition. However, the positioning accuracy depends largely on an environment and generally becomes a relatively low accuracy of 3 m or more.

The method using visible light communication allows individual recognition, and furthermore allows the obtainment of a relatively high positioning accuracy of approximately several tens cm, but does not allow the detection of a person in a place where visible light is blocked, and it is hard to maintain the stability of detection accuracy since there are many noise sources and interference sources such as natural light and other visible lights.

In contrast to these technologies, the method to be carried out by the positioning server apparatus 100 of the embodiment allows individual recognition, and furthermore allows the obtainment of a high positioning accuracy equivalent to a human shoulder breadth or step length and moreover the detection of not only the position of a person but also the action state of the person. Specifically, according to the method to be carried out by the positioning server apparatus 100 of the embodiment, it is possible to detect, as the action states of a person, the postures and actions that can daily be performed by an employee in an office, in other words, walking (standing state), standing up (stationary state), seating oneself in a chair, squatting during execution of work, changing the orientation (direction) in the sitting or standing state, looking up to the sky in the sitting or standing state, looking down in the sitting or standing state, and the like.

Hence, in the embodiment, the positioning server apparatus 100 is configured to detect the absolute position of an employee in an office being a control target area and the action state of the employee by the above-mentioned method, based on detection data of the accelerometers, gyro-sensors, and magnetometers of the smartphone 300 and the sensor group 301. However, the method for detecting the absolute position of an employee in an office being a control target area and the action state of the employee is not limited to the above-mentioned method to be carried out by the positioning server apparatus 100. It may be configured to detect the absolute position and action state of the employee, for example, by one of the above-mentioned other methods or a combination of a plurality of them, and may be configured to detect the absolute position and action state of an employee in combination of the above-mentioned method to be carried out by the positioning server apparatus 100 and one or a plurality of the above-mentioned other methods.

According to the embodiments, it is possible to take an effect that it is possible to determine the type of a device with higher accuracy even if there exists a plurality of persons or devices.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A type determination apparatus, comprising:
   an acquisition unit configured to chronologically acquire power consumption consumed by an electrical device; and
   a determination unit configured to determine that a type of the electrical device is a type to be determined based on a reference pattern representing a predetermined pattern of a power fluctuation and on a fluctuation pattern of the power consumption acquired for a duration equal to or more than a reference period of time, when the fluctuation pattern matches the reference pattern.

2. The type determination apparatus according to claim 1, wherein
   the reference pattern represents magnitude of a power fluctuation, and
   the determination unit is configured to determine that the type of the electrical device is the type to be determined in accordance with the reference pattern when the magnitude of a fluctuation of the acquired power consumption is matched with the magnitude of the power fluctuation represented by the reference pattern.

3. The type determination apparatus according to claim 1, wherein
   the acquisition unit is configured to chronologically acquire power consumption consumed by a first device and a second device,
   the reference pattern represents that power consumed by the devices fluctuates in interconnection, and
   the determination unit is configured to determine that types of the first and second devices are types to be determined in accordance with the reference pattern when the power consumption of the first device and the power consumption of the second device fluctuate in interconnection.

4. The type determination apparatus according to claim 1, wherein
   the reference pattern represents that power fluctuates to a predetermined power threshold value or less, and
   the determination unit is configured to determine the type of the electrical device is the type to be determined in accordance with the reference pattern when the acquired power consumption is equal to or less than the power threshold value.

5. The type determination apparatus according to claim 1, wherein
   the reference pattern represents that power occurs at a predetermined time, and
   the determination unit is configured to determine that the type of the electrical device is the type to be determined in accordance with the reference pattern when the acquired power consumption occurs at the predetermined time.

6. The type determination apparatus according to claim 1, further comprising a device control unit configured to stop power supplied to the electrical device when the determined type is a predetermined specific type.

7. A type determination method comprising:
   chronologically acquiring power consumption consumed by an electrical device; and
   determining that a type of the electrical device is a type to be determined based on a reference pattern representing a predetermined pattern of a power fluctuation and on a fluctuation pattern of the power consumption acquired for a duration equal to or more than a reference period of time when the fluctuation pattern matches the reference pattern.

8. A non-transitory computer-readable storage medium with an executable program stored thereon, wherein the program instructs a computer to perform:
   chronologically acquiring power consumption consumed by an electrical device; and
   determining that a type of the electrical device is a type to be determined based on a reference pattern representing a predetermined pattern of a power fluctuation and on a fluctuation pattern of the power consumption acquired for a duration equal to or more than a reference period of time when the fluctuation pattern matches the reference pattern.

* * * * *